US 7,860,185 B2

(12) United States Patent
Utsunomiya et al.

(10) Patent No.: US 7,860,185 B2
(45) Date of Patent: Dec. 28, 2010

(54) DISTORTION COMPENSATING APPARATUS AND POWER AMPLIFIER APPARATUS

(75) Inventors: Yuichi Utsunomiya, Kawasaki (JP); Hiroyoshi Ishikawa, Kawasaki (JP); Nobukazu Fudaba, Kawasaki (JP); Hajime Hamada, Kawasaki (JP); Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 71 days.

(21) Appl. No.: 12/333,576

(22) Filed: Dec. 12, 2008

(65) Prior Publication Data

US 2009/0190647 A1    Jul. 30, 2009

(30) Foreign Application Priority Data

Jan. 28, 2008    (JP)    ............... 2008-015897

(51) Int. Cl.
  $H04L\ 25/49$    (2006.01)
  $H03K\ 5/159$    (2006.01)
  $H03C\ 3/08$    (2006.01)

(52) U.S. Cl. .................. 375/296; 375/232; 332/123

(58) Field of Classification Search ................ 375/229, 375/232, 233, 296, 285, 297; 332/106, 107, 332/124–127
See application file for complete search history.

(56) References Cited

U.S. PATENT DOCUMENTS

| 7,433,421 | B2 * | 10/2008 | Shako et al. | ................ 375/296 |
| 7,466,762 | B2 * | 12/2008 | Shako et al. | ................ 375/296 |
| 7,613,251 | B2 * | 11/2009 | Shako et al. | ................ 375/296 |
| 2003/0184372 | A1 | 10/2003 | Fudaba et al. | |
| 2005/0210354 | A1 | 9/2005 | Kurokami | |

FOREIGN PATENT DOCUMENTS

| JP | 2000-299652 | 10/2000 |
| JP | 2003-283586 | 10/2003 |
| JP | 2003-298362 | 10/2003 |
| JP | 2004-128833 | 4/2004 |
| WO | 2004077660 | 9/2004 |

OTHER PUBLICATIONS

European Search Report dated Feb. 17, 2009, from the corresponding European Application.
Korean Office Action dated Jul. 28, 2010, from the corresponding Korean Application.

* cited by examiner

*Primary Examiner*—Tesfaldet Bocure
(74) *Attorney, Agent, or Firm*—Katten Muchin Rosenman LLP

(57) ABSTRACT

A distortion compensating apparatus has an adaptive distortion compensating unit to compensate nonlinear distortion by controlling an input signal of a nonlinear distortion circuit by using an adaptive algorithm so as to reduce an error between a reference signal and a feedback signal from the nonlinear distortion circuit; and an adaptive equalizer connected between the adaptive distortion compensating unit and the nonlinear distortion circuit or provided in front of the adaptive distortion compensating unit. The adaptive equalizer includes a digital filter to form an amplitude characteristic and a phase characteristic of the input signal on the basis of a filter coefficient group that is set to the digital filter; a memory to hold in advance the filter coefficient group; and a control unit to control reading of the filter coefficient group from the memory on the basis of the input signal and the feedback signal.

12 Claims, 21 Drawing Sheets

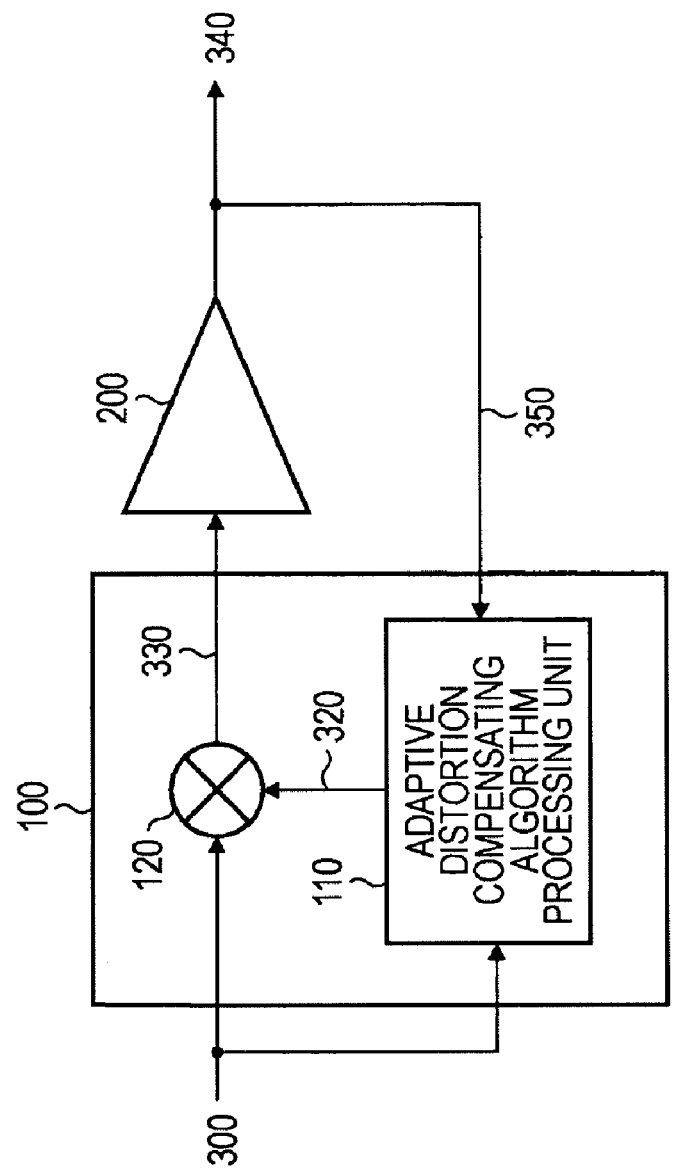

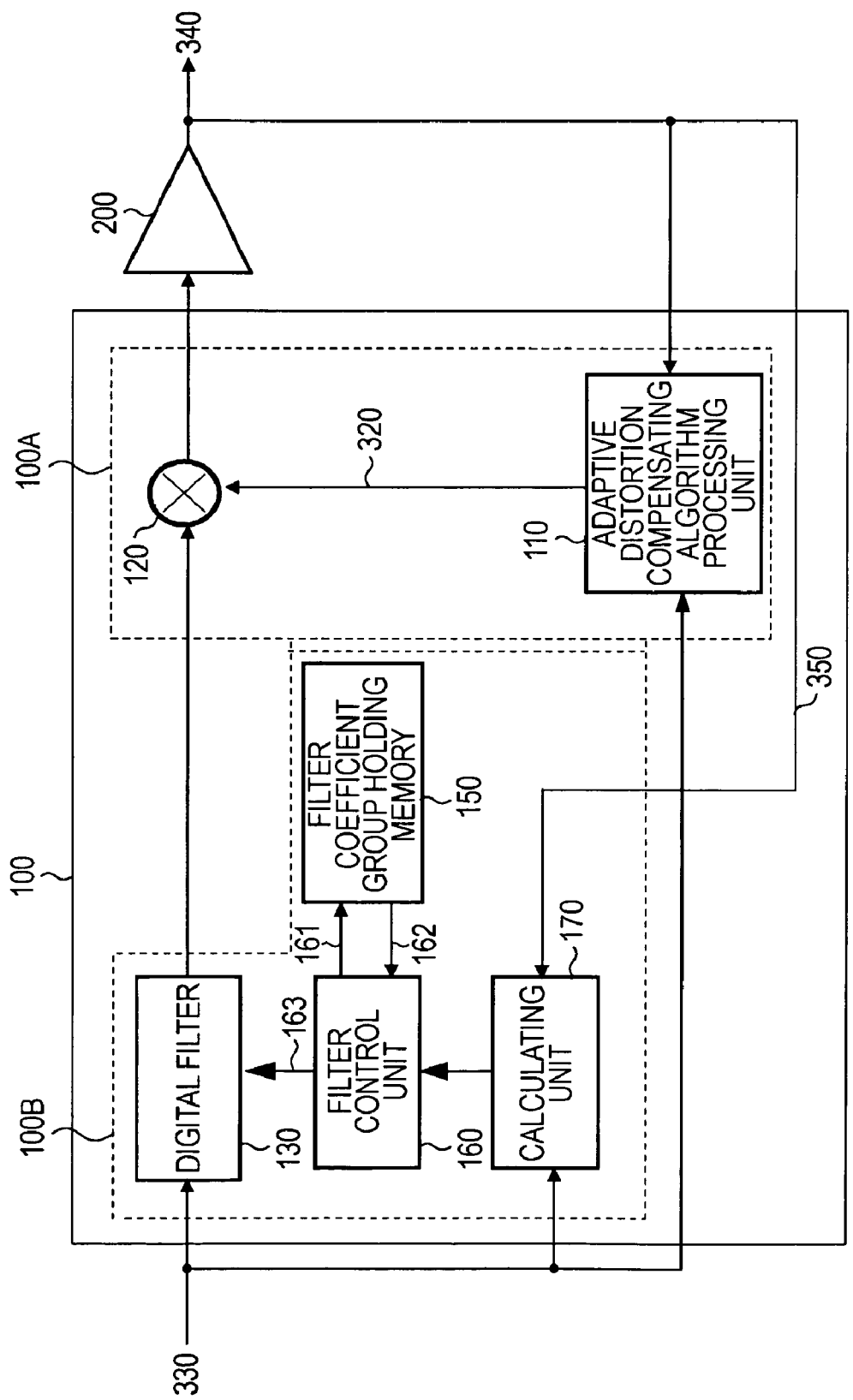

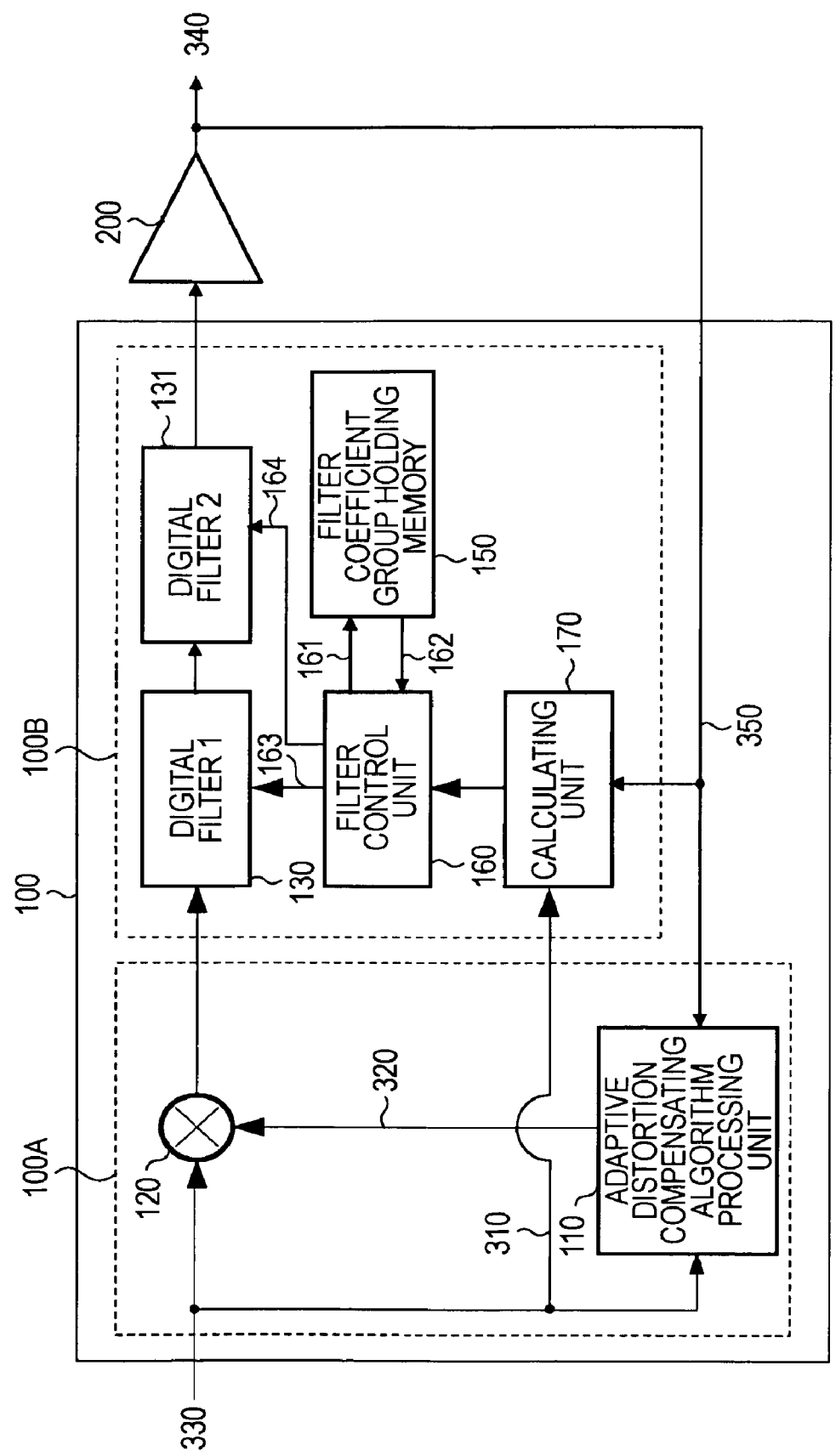

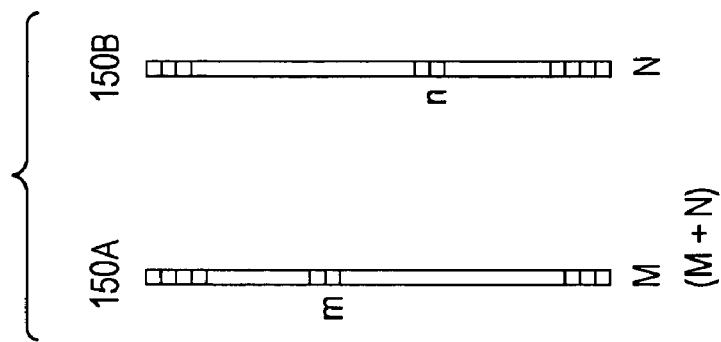
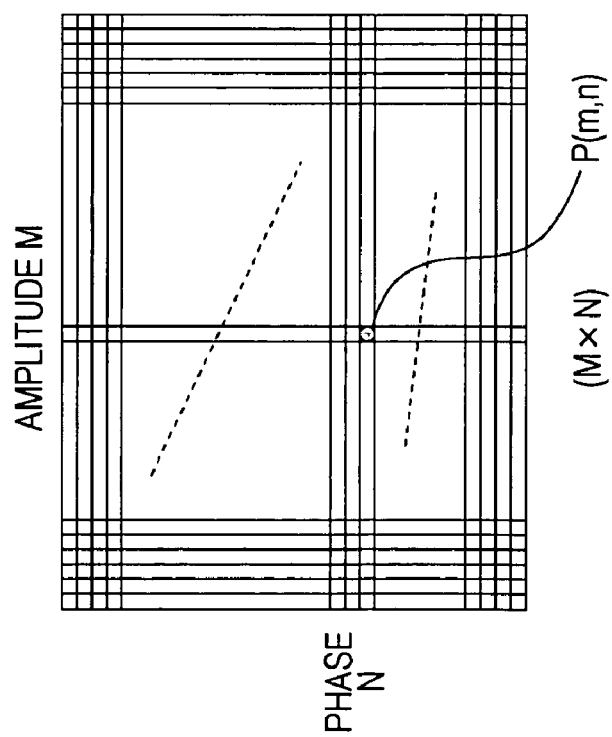

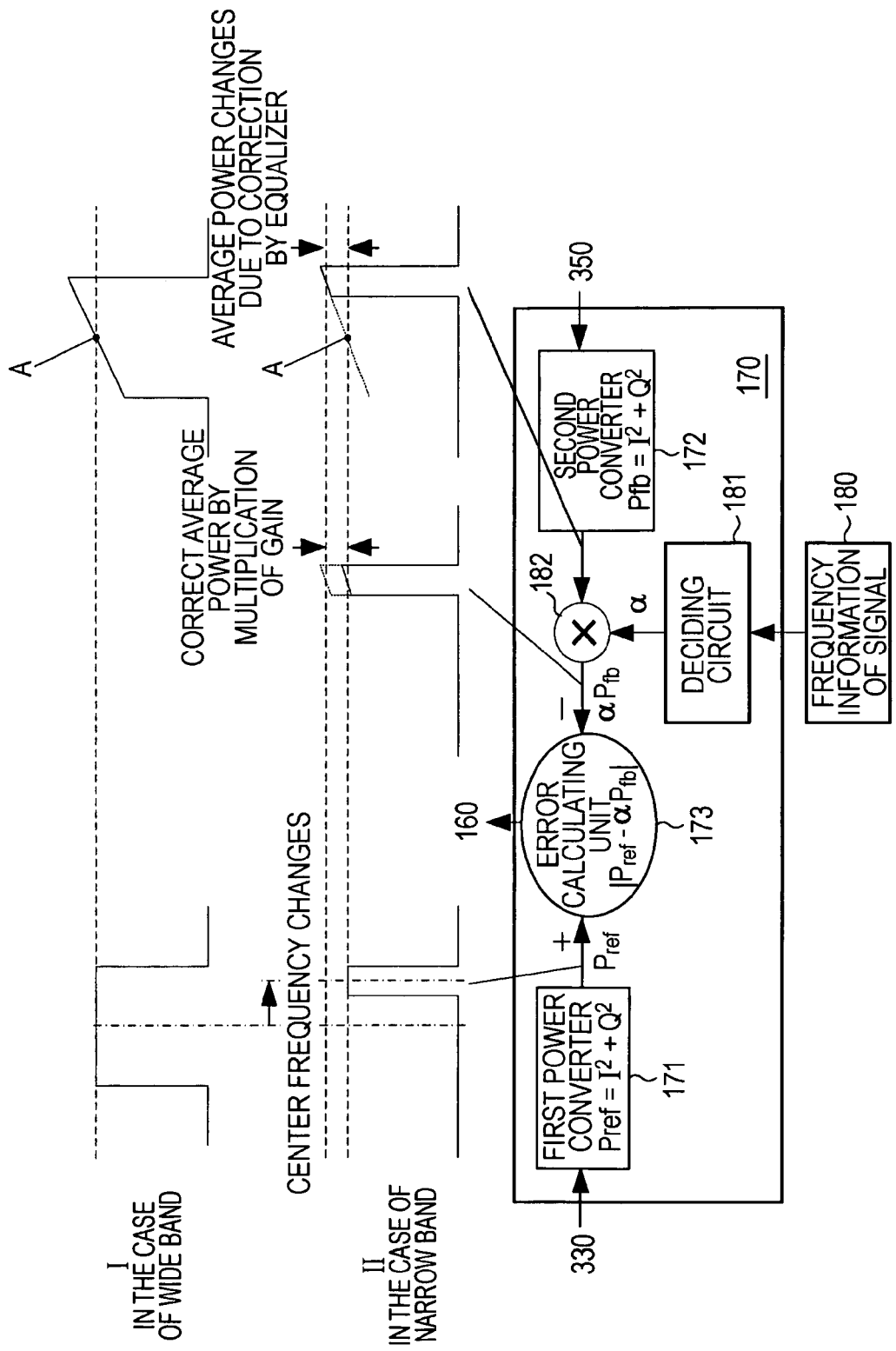

DISTORTION COMPENSATING APPARATUS AND POWER AMPLIFIER APPARATUS

CROSS-REFERENCE TO RELATED APPLICATION

This application is based upon and claims the benefit of priority of the prior Japanese Patent Application No. 2008-15897, filed on Jan. 28, 2008, the entire contents of which are incorporated herein by reference.

FIELD

The present invention relates to a distortion compensating apparatus and a power amplifier apparatus including the same. The distortion compensating apparatus and the power amplifier apparatus include, for example, a technique enabling effective setting of equalizer filter coefficients of different frequency characteristics.

BACKGROUND

In a conventional transmitter apparatus in a radio communication system, nonlinear distortion that occurs as a result of amplifying a signal in a power amplifier is compensated and usage efficiency of the power amplifier is enhanced by using the power amplifier in a saturation region.

FIG. 1 illustrates a distortion compensating apparatus 100 to compensate a characteristic of a nonlinear circuit that includes a power amplifier 200 by using a feedback loop. The distortion compensating apparatus 100 includes an adaptive distortion compensating algorithm processing unit 110 and a multiplier 120.

FIG. 2A is a graph illustrating input/output power characteristics of the power amplifier 200 illustrated in FIG. 1. The graph illustrates a linear region A1 where input power and output power exhibit a proportional characteristic and a nonlinear region A2 (indicated with a solid line) where output power approaches a saturation state.

The adaptive distortion compensating algorithm processing unit 110 receives a transmission signal 300 serving as a reference signal and part of a radio frequency (RF) output signal 340 of the power amplifier 200 serving as a feedback signal 350, and calculates a distortion compensating coefficient 320 by operating an adaptive algorithm so as to minimize the error between those signals. The multiplier 120 supplies a signal 330, which is generated by multiplying the transmission signal 300 by the distortion compensating coefficient 320, to an input terminal of the power amplifier 200.

That is, the distortion compensating apparatus 100 compensates nonlinear distortion of the power amplifier 200 by multiplying the transmission signal 300 by the distortion compensating coefficient 320 in advance and then supplying the signal 330 generated through the multiplication to the power amplifier 200. As a result, usage efficiency can be enhanced by using the power amplifier 200 in the region "A2" illustrated in FIG. 2A.

FIG. 2B illustrates an effect of the distortion compensation. The horizontal axis indicates frequency, whereas the vertical axis indicates amplitude (radiation power or voltage). The frequency characteristic of radiation power before distortion compensation is indicated with a solid line. Radiation powers B1 and B2 are generated in bands C1 and C3 outside a band C2 of an input signal. The radiation power levels in the bands C1 and C3 after distortion compensation (broken lines) are decreased to radiation power levels B1A and B2A.

In the above-described conventional distortion compensating apparatus, an influence of a frequency characteristic of an analog circuit other than nonlinear distortion needs to be reduced in order to prevent impairment of an effect of distortion compensation. Such an influence can be reduced to some extent by performing equalization using a filter having a reverse characteristic of the frequency characteristic of the analog circuit including the power amplifier 200.

However, the characteristics of the analog circuit significantly varies due to change in temperature or over time, and thus an adaptive equalizer is required. In this point of view, the applicant of the present application has suggested a distortion compensating apparatus to adaptively compensate a nonlinear characteristics of a circuit having nonlinear distortion (Japanese Laid-open Patent Application Publication No. 2003-298362, hereinafter referred to as Patent Document 1).

FIG. 3 is a block diagram illustrating a basic configuration of the distortion compensating apparatus 100 disclosed in Patent Document 1.

Referring to FIG. 3, the distortion compensating apparatus 100 includes an adaptive distortion compensating unit 100A to compensate nonlinear distortion by controlling an input signal of a power amplifier 200 by using an adaptive algorithm so that an error between a reference signal which is a transmission signal 300 and a feedback signal 350 from the power amplifier 200 having nonlinear distortion becomes small.

Furthermore, the distortion compensating apparatus 100 includes an adaptive equalizer 100B provided between the adaptive distortion compensating unit 100A and the power amplifier 200 or connected to the front part of the adaptive distortion compensating unit 100A.

The adaptive equalizer 100B includes a digital filter 130, a filter coefficient group holding memory 150 to hold in advance filter coefficients some of which are to be set to the digital filter 130, and an adaptive equalization processing unit 140 to adaptively select a filter coefficient for reducing out-of-band radiation power of a feedback signal from the filter coefficient group and to set the selected filter coefficient to the digital filter 130.

According to the invention described in Patent Document 1, part of an RF output signal 340 from the power amplifier 200 is input as the feedback signal 350, the average out-of-band radiation power is measured by the adaptive equalization processing unit 140, a coefficient value held in advance in the filter coefficient group holding memory (hereinafter referred to simply as "memory") 150 is selected and read by using a measurement value obtained from the measurement as an address, and the coefficient value is set to the digital filter 130.

Here, in the selection of an equalizer filter through measurement of out-of-band radiation power in Patent Document 1, that is, in the method for selecting a coefficient for the digital filter 130, analysis based on Fourier transform is performed to measure out-of-band radiation power by the adaptive equalization processing unit 140.

For this reason, the number of calculations increases and longer time is required to select a filter coefficient disadvantageously. Furthermore, there are unsolved problems associated with the poor track ability for variations in power of the transmission signal 300 is poor, and with the need to change a measurement point of out-of-band radiation power when band variation occurs.

SUMMARY

In view of the above-described circumstances, embodiments discussed herein provide a distortion compensating apparatus capable of shortening the time required to select a filter coefficient in the distortion compensating apparatus and increasing resistance against power variations of a transmission signal, and provide a power amplifier apparatus including the distortion compensating apparatus.

According to an aspect of the embodiments, a distortion compensating apparatus has an adaptive distortion compensating unit to compensate nonlinear distortion by controlling an input signal of a nonlinear distortion circuit by using an adaptive algorithm so as to reduce an error between a reference signal and a feedback signal from the nonlinear distortion circuit having the nonlinear distortion; and an adaptive equalizer connected between the adaptive distortion compensating unit and the nonlinear distortion circuit or to a front part of the adaptive distortion compensating unit, wherein the adaptive equalizer includes a digital filter to form an amplitude characteristic and a phase characteristic of the input signal on the basis of a filter coefficient group that is set to the digital filter; a memory to hold in advance the filter coefficient group to be set to the digital filter; and a control unit to control reading of the filter coefficient group to be set to the digital filter from the memory on the basis of the input signal and the feedback signal from the nonlinear distortion circuit.

And according to another aspect of the embodiments, a power amplifier apparatus has a power amplifier; and a distortion compensating apparatus connected to an input side of the power amplifier, wherein the distortion compensating apparatus includes an adaptive distortion compensating unit to compensate nonlinear distortion by controlling an input signal of the power amplifier by using an adaptive algorithm so as to reduce an error between a transmission signal and a feedback signal from the power amplifier; and an adaptive equalizer connected between the adaptive distortion compensating unit and the power amplifier or connected to a front part of the adaptive distortion compensating unit, and wherein the adaptive equalizer includes a digital filter to form an amplitude characteristic and a phase characteristic of the input signal on the basis of a filter coefficient group that is set to the digital filter; a memory to hold in advance the filter coefficient group to be set to the digital filter; and a control unit to control reading of the filter coefficient group to be set to the digital filter from the memory on the basis of the input signal and the feedback signal from the power amplifier.

Additional objects and advantages of the embodiment will be set forth in part in the description which follows, and in part will be obvious from the description, or may be learned by practice of the embodiment. The object and advantages of the embodiment will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

FIG. 1 illustrates a distortion compensating apparatus according to a related art to compensate a characteristic of a nonlinear circuit including a power amplifier by using a feedback loop;

FIG. 7 is a block diagram illustrating a configuration of a distortion compensating apparatus according to a second embodiment;

FIG. 8 is a block diagram illustrating a configuration of a distortion compensating apparatus according to a third embodiment;

FIGS. 9A and 9B illustrate memory capacity in the case of setting a coefficient of an optimum value by using a combination of a group of filter coefficients of different amplitude characteristics and a group of filter coefficients of different phase characteristics;

FIG. 20 illustrates a configuration and an operation of the calculating unit in the case where a frequency band of a transmission signal is narrow.

DESCRIPTION OF THE EMBODIMENTS

Hereinafter, a distortion compensating apparatus and a power amplifier apparatus disclosed according to embodiments are described with reference to the drawings.

First Embodiment

Figure 2B:
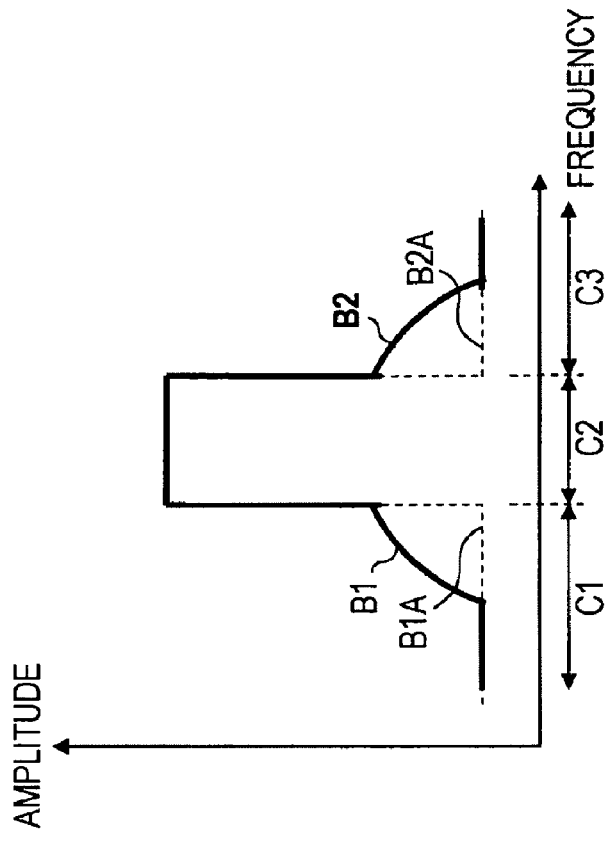
FIG. 2B illustrates an effect of distortion compensation according to the related art.
Figure 2A:
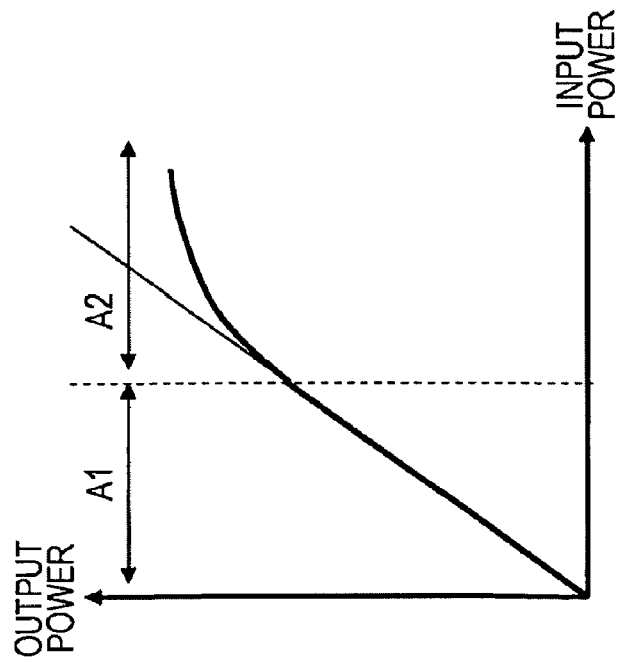
FIG. 2A illustrates input/output power characteristics of the power amplifier illustrated in FIG. 1 according to the related art.
Figure 3:
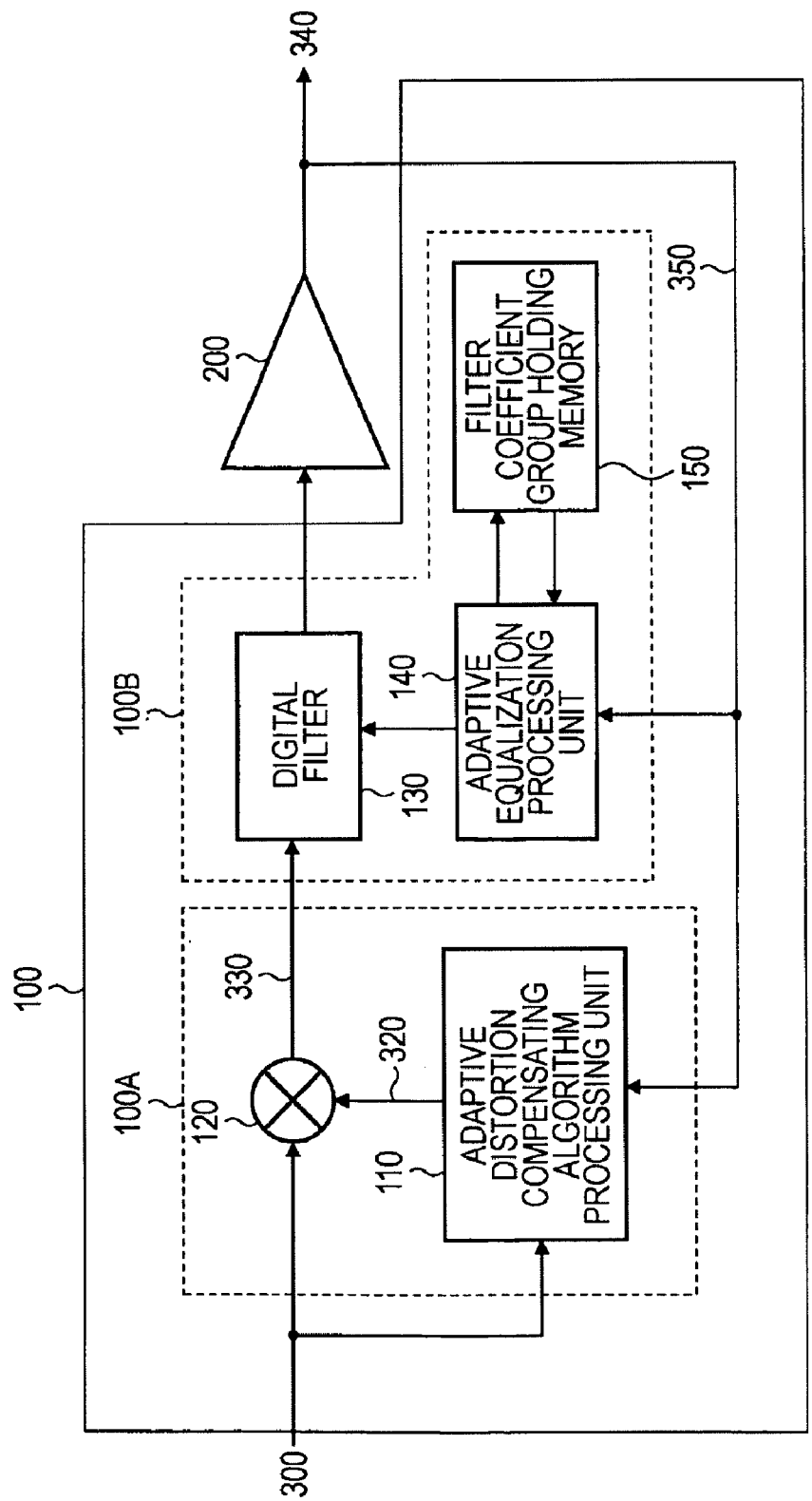
FIG. 3 is a block diagram illustrating a basic configuration of a distortion compensating apparatus according to Patent Document 1 as a related art.
Figure 4:
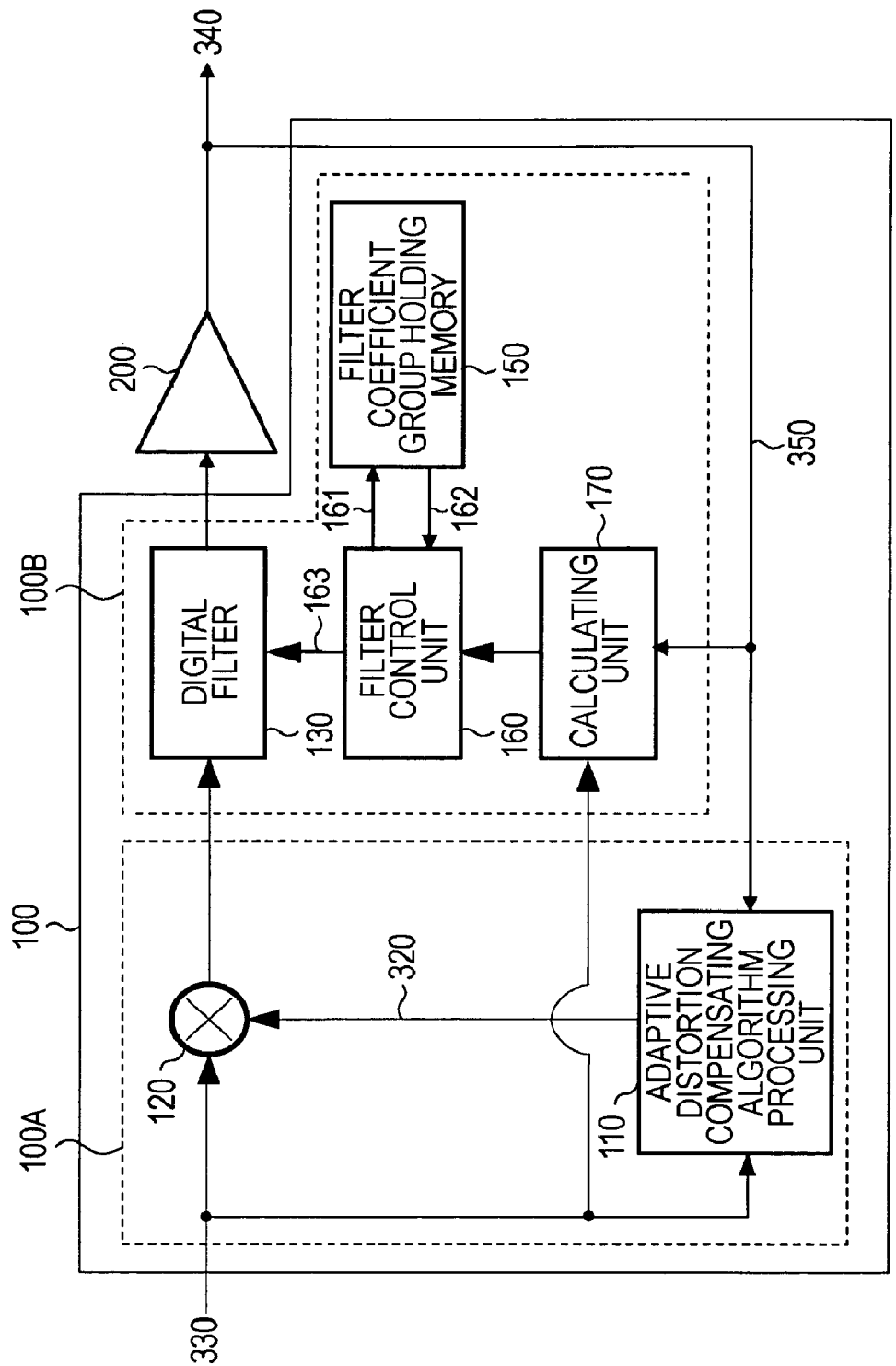
FIG. 4 is a block diagram illustrating a configuration of a distortion compensating apparatus according to a first embodiment.

FIG. 4 is a block diagram of a configuration of a distortion compensating apparatus 100 according to a first embodiment. Referring to FIG. 4, the distortion compensating apparatus 100 includes an adaptive distortion compensating unit 100A and an adaptive equalizer 100B.

The first embodiment is characterized by the configuration of the adaptive equalizer 100B. The function of the adaptive distortion compensating unit 100A is the same as that described above. Thus, a further description about the adaptive distortion compensating unit 100A is omitted, and the adaptive equalizer 100B is described below.

Referring to FIG. 4, the adaptive equalizer 100B includes a digital filter 130, a filter coefficient group holding memory 150 to hold in advance a filter coefficient group to be set to the digital filter 130, and a filter control unit 160 to adaptively select a filter coefficient from the filter coefficient group on the basis of an output of a calculating unit 170 and set the selected filter coefficient to the digital filter 130.

Here, the calculating unit 170 has a function of calculating an error between a transmission signal 330 as a reference signal and a feedback signal 350.

The filter control unit 160 adaptively selects, on the basis of the error between the transmission signal 330 and the feedback signal 350 calculated in the calculating unit 170, a filter coefficient to minimize the error calculated in the calculating unit 170 from the filter coefficient group held in advance in the memory 150, and sets the coefficient of the digital filter 130 which is a complex filter.

By allowing the memory 150 to hold the filter coefficient group in advance, the amount of calculation that is a problem in a reverse characteristic calculating type equalizer can be reduced. The output signal of the digital filter 130 is digital/analog-converted by a D/A converter, is up-converted to a radio frequency by a modulator, and is output as a radio frequency (RF) output signal 340 through the power amplifier 200.

Figure 5:
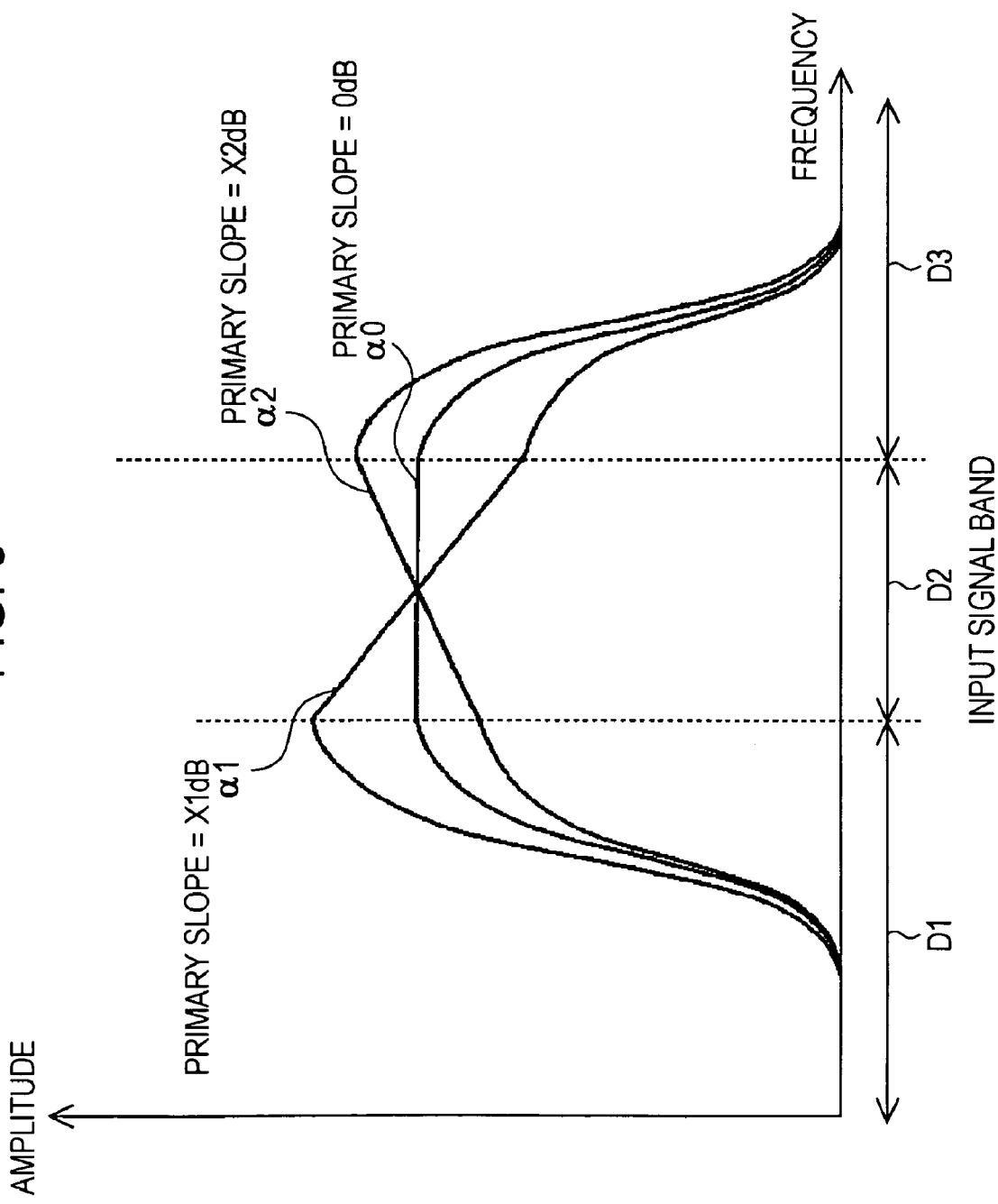
FIG. 5 illustrates an example of amplitude characteristics of digital filters to which a filter coefficient group held in a memory is set.

FIG. 5 illustrates an example of amplitude characteristics of the digital filter 130 to which the filter coefficient group held in the memory 150 is set. The example in FIG. 5 particularly illustrates amplitude characteristics of three filters having amplitude characteristics to correct primary amplitude deviation. That is, FIG. 5 illustrates an example of amplitude characteristics of a filter having no primary slope (e.g., having a primary slope $\alpha 0$), a filter having a primary slope $\alpha 1$ of X1 dB, and a filter having a primary slope $\alpha 2$ of X2 dB in a band D2 of the transmission signal 330.

Out-of-band amplitude characteristics (in bands D1 and D3) of those filters have a gentle curve, such as a raised cosine, for example. Those filters are designed in advance, and the filter coefficients thereof are held in the memory 150.

The range of an in-band slope of amplitude (X1 dB to X2 dB) and a slope step size ($\Delta$ dB) representing the width of change in slope is determined in accordance with a memory capacity used and the amount of change in frequency characteristic of a nonlinear distortion circuit (power amplifier 200).

For example, when a slope range is −2 to +2 dB and when a slope step size $\Delta=0.05$ dB, the number of filter coefficients held in the memory 150 is 81 ($=(|X1|+|X2|)/\Delta+1$).

When the frequency characteristic of the nonlinear distortion circuit including the power amplifier 200 is equalized by the digital filter 130, the error between the feedback signal 350 and the transmission signal 330 is minimized. Therefore, the amplitude deviation of the nonlinear distortion circuit including the power amplifier 200 can be approximately equalized by selecting a filter coefficient to minimize the error from the filter coefficient group.

Figure 6A:
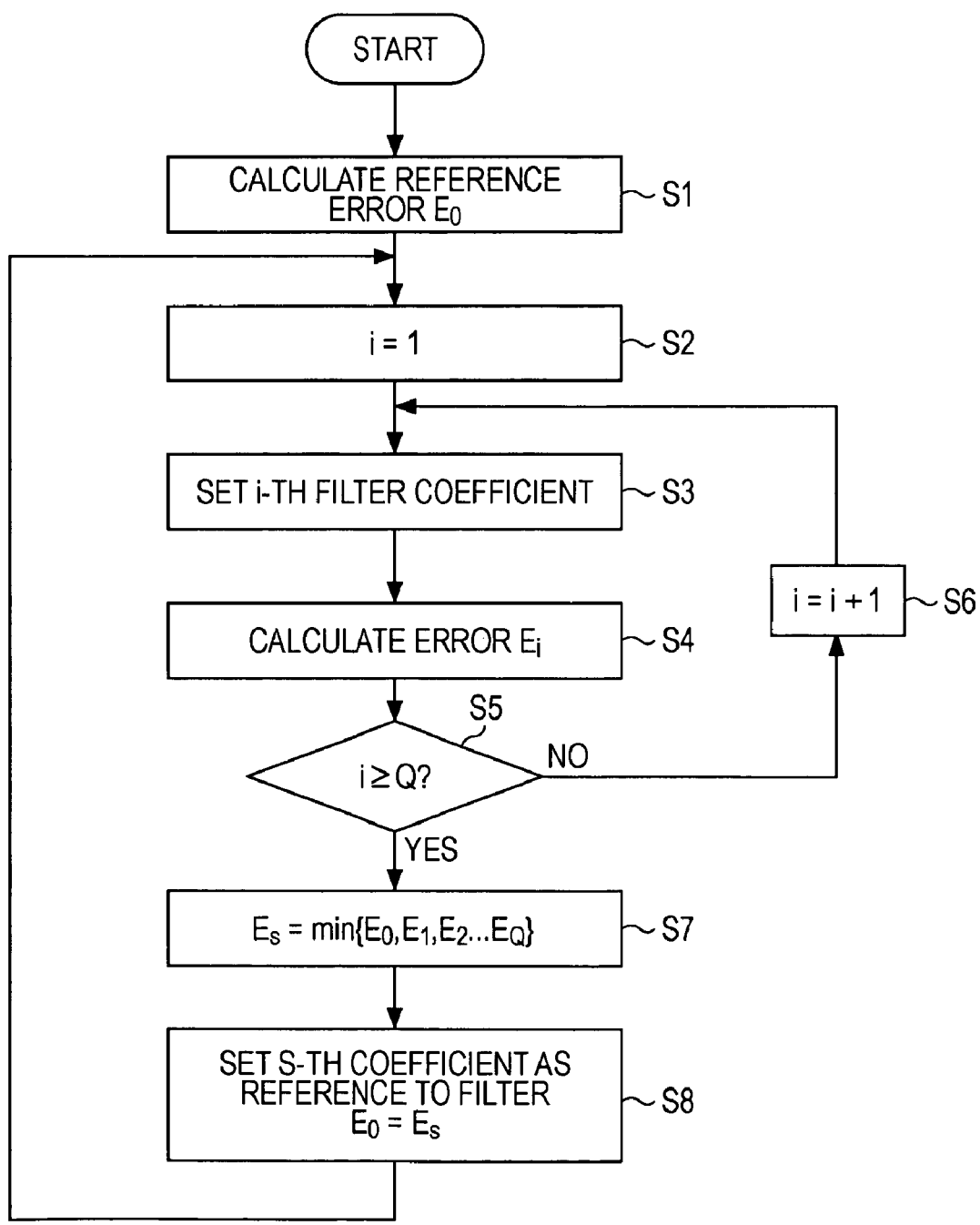
FIG. 6A illustrates a process sequence of an adaptive equalizer in the distortion compensating apparatus illustrated in FIG. 4.

FIG. 6A illustrates a process sequence of the adaptive equalizer 100B in the distortion compensating apparatus 100 illustrated in FIG. 4.

The calculating unit 170 calculates the error between the transmission signal 330 and the feedback signal 350 (step S1) and sets a counter value i to 1 (step S2).

The filter control unit 160 supplies a selection signal 161 to the memory 150 on the basis of the error calculated by the calculating unit 170, decides filter coefficients of Q in-band slopes $\alpha 1$ to $\alpha Q$ to be compared with an in-band slope $\alpha 0$ as a reference, selects a first (i-th) filter coefficient 162 from among the decided filter coefficients, and outputs the filter coefficient 162 so as to set it to the digital filter 130 (step S3).

Then, the calculating unit 170 calculates an error $E_i$ in the state where the i-th filter coefficient has been set to the digital filter 130 (step S4).

If the counter value has not reached the given number Q (NO in step S5), the process proceeds to step S6, where the filter control unit 160 increments the counter value i by one (i=i+1). Then, the process returns to step S3, where the filter control unit 160 sets the (i+1)-th coefficient. In this way, the filter control unit 160 resets an updated coefficient to the digital filter 130 until the counter value reaches the given number Q.

After the counter value has reached the given number Q (YES in step S5), a minimum error $E_s$ among the respective errors in the set coefficients corresponding to the predetermined number Q is determined (step S7).

Figure 6B:
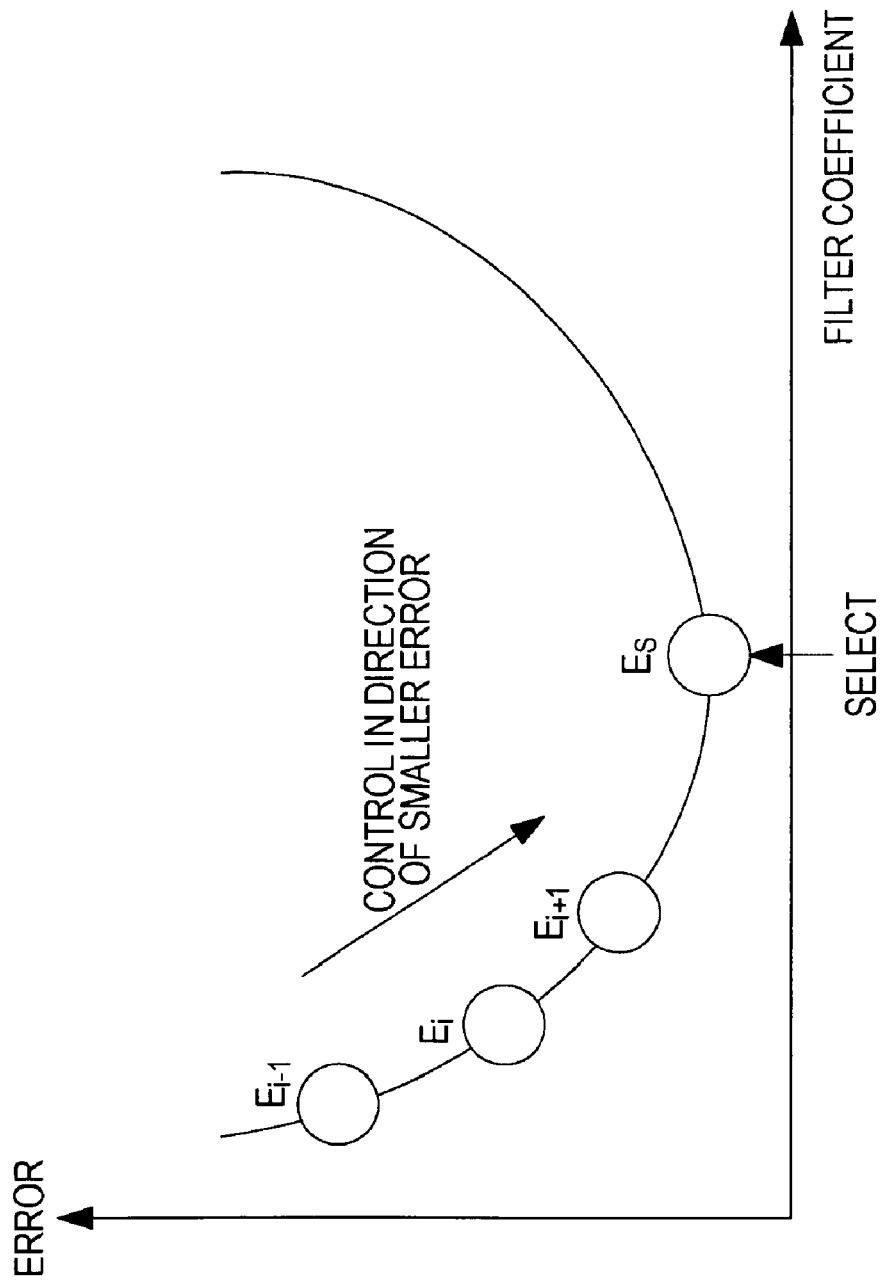
FIG. 6B illustrates the relationship between filter coefficients and errors.

FIG. 6B illustrates the relationship between the filter coefficients and the errors. The horizontal axis indicates the filter coefficients, whereas the vertical axis indicates the magnitude of errors corresponding to the filter coefficients. The error changes in accordance with changes in the filter coefficient. There exists a coefficient value corresponding to the minimum error $E_s$ for the setting of the plurality of filter coefficients.

Thus, the filter control unit 160 determines the coefficient corresponding to the minimum error in step S7 and sets the coefficient as a reference value to the digital filter 130 in step S8. Then, the process returns to step S2, and the distortion compensating apparatus 100 repeats the above-described process in an operation.

Second Embodiment

FIG. 7 is a block diagram of a configuration of a distortion compensating apparatus 100 according to a second embodiment.

In the first embodiment, the adaptive equalizer 100B is placed between the adaptive distortion compensating unit 100A and the power amplifier 200. In the second embodiment, the adaptive equalizer 100B is placed in front of the adaptive distortion compensating unit 100A as illustrated in FIG. 7.

The operation according to the second embodiment is the same as that described above in the first embodiment, and thus the corresponding description is omitted.

Third Embodiment

FIG. 8 is a block diagram of a configuration of a distortion compensating apparatus 100 according to a third embodiment.

The distortion compensating apparatus 100 according to the third embodiment differs from the first embodiment illustrated in FIG. 4 in that the third embodiment includes first and second digital filters 130 and 131. The distortion compensating apparatus 100 according to the third embodiment includes the two digital filters 130 and 131 that are cascaded, and compensates frequency deviations of amplitude and phase by using the respective digital filters.

That is, the distortion compensating apparatus 100 compensates amplitude deviation by using the first digital filter 130 and compensates phase deviation by using the second digital filter 131. Alternatively, the distortion compensating apparatus 100 compensates phase deviation by using the first digital filter 130 and compensates amplitude deviation by using the second digital filter 131.

Thus, the filter coefficient group holding memory 150 holds a group of filter coefficients of different phase characteristics in addition to the group of filter coefficients of different amplitude characteristics described above with reference to FIG. 5.

Now, an advantage of the third embodiment is described.

In the case of setting a coefficient of an optimum value by using a combination of a group of filter coefficients of different amplitude characteristics and a group of filter coefficients of different phase characteristics, the capacity of the memory 150 increases disadvantageously. This problem may be prevented by using the configuration illustrated in FIG. 8.

FIGS. 9A and 9B illustrate comparison between the case of using a single digital filter and the case of using the configuration illustrated in FIG. 8, regarding the capacity of the memory 150 in the case of setting a coefficient of an optimum value by using a combination of a group of filter coefficients of different amplitude characteristics and a group of filter coefficients of different phase characteristics.

FIG. 9A illustrates an example of holding a combination of a group of filter coefficients of M different amplitude characteristics and a group of filter coefficients of N different phase characteristics in the memory 150 by expanding them on a two-dimensional plane. In this case, memory capacity corresponding to M×N different combination areas is necessary. Coefficient data at a combination position P (n, m) in the M×N different combination areas is read and the coefficient of the digital filter 130 is set.

Here, since the digital filter 130 is a complex filter, respective filter coefficients have data of a real part and an imaginary part. Furthermore, the amount of coefficient data required to be prepared corresponds to the number of taps of the digital filter 130. Accordingly, the capacity of the memory 150 inevitably becomes large in the configuration illustrated in FIG. 9A.

On the other hand, in the configuration illustrated in FIG. 9B corresponding to the third embodiment illustrated in FIG. 8, only M+N data areas are required, that is, the memory 150 stores data of a group of filter coefficients of M different amplitude characteristics and a group of filter coefficients of N different phase characteristics. Accordingly, the capacity of the memory 150 can be reduced.

That is, in the configuration illustrated in FIG. 9B corresponding to the third embodiment illustrated in FIG. 8, the filter control unit 160 reads the filter coefficient of the m-th amplitude characteristic from a group 150A of filter coefficients of M different amplitude characteristics held in the memory 150, and sets the read filter coefficient to the first digital filter 130. At the same time, the filter control unit 160 reads the filter coefficient of the n-th phase characteristic from a group 150B of filter coefficients of N different phase characteristics held in the memory 150, and sets the read filter coefficient to the second digital filter 131. Accordingly, the filter control unit 160 can set the amplitude characteristic and the phase characteristic corresponding to the combination of (m, n).

The error signal calculated by the calculating unit 170 in the above-described first to third embodiments may have various forms. Hereinafter, methods for calculating the error in the calculating unit 170 are described in the fourth to eleventh embodiments.

Fourth Embodiment

Figure 10:
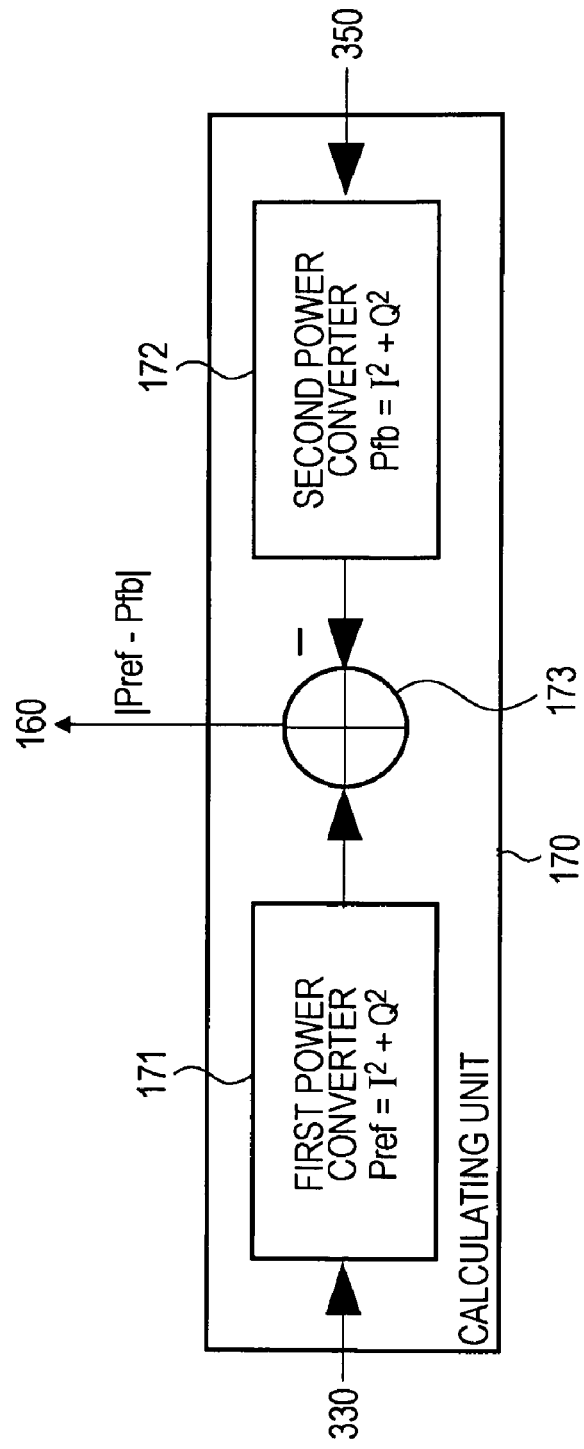
FIG. 10 illustrates a configuration of a calculating unit according to a fourth embodiment applicable to the first to third embodiments illustrated in FIGS. 4, 7, and 8.

FIG. 10 illustrates a configuration of a calculating unit 170 according to the fourth embodiment applicable to the first to third embodiments illustrated in FIGS. 4, 7, and 8.

The calculating unit 170 includes a first power converter 171 to receive a transmission signal 330, which is a complex signal serving as a reference signal, and to calculate a power value $Pref=I^2+Q^2$ of the transmission signal 330; and a second power converter 172 to receive a feedback signal 350, which is a complex signal, and to calculate a power value $Pfb=I^2+Q^2$ of the feedback signal 350.

Furthermore, the calculating unit 170 includes an adder 173 to calculate an error between the power value Pref of the transmission signal 330 and the power value Pfb of the feedback signal 350. With this configuration, the adder 173 in the calculating unit 170 transmits a signal |Pref−Pfb| corresponding to the level of power error to the filter control unit 160.

The filter control unit 160 sequentially reads filter coefficients from the filter coefficient group held in the memory 150, on the basis of the signal |Pref−Pfb| that corresponds to the level of power error, and sets the read filter coefficients to the digital filter 130.

Fifth Embodiment

Figure 11:
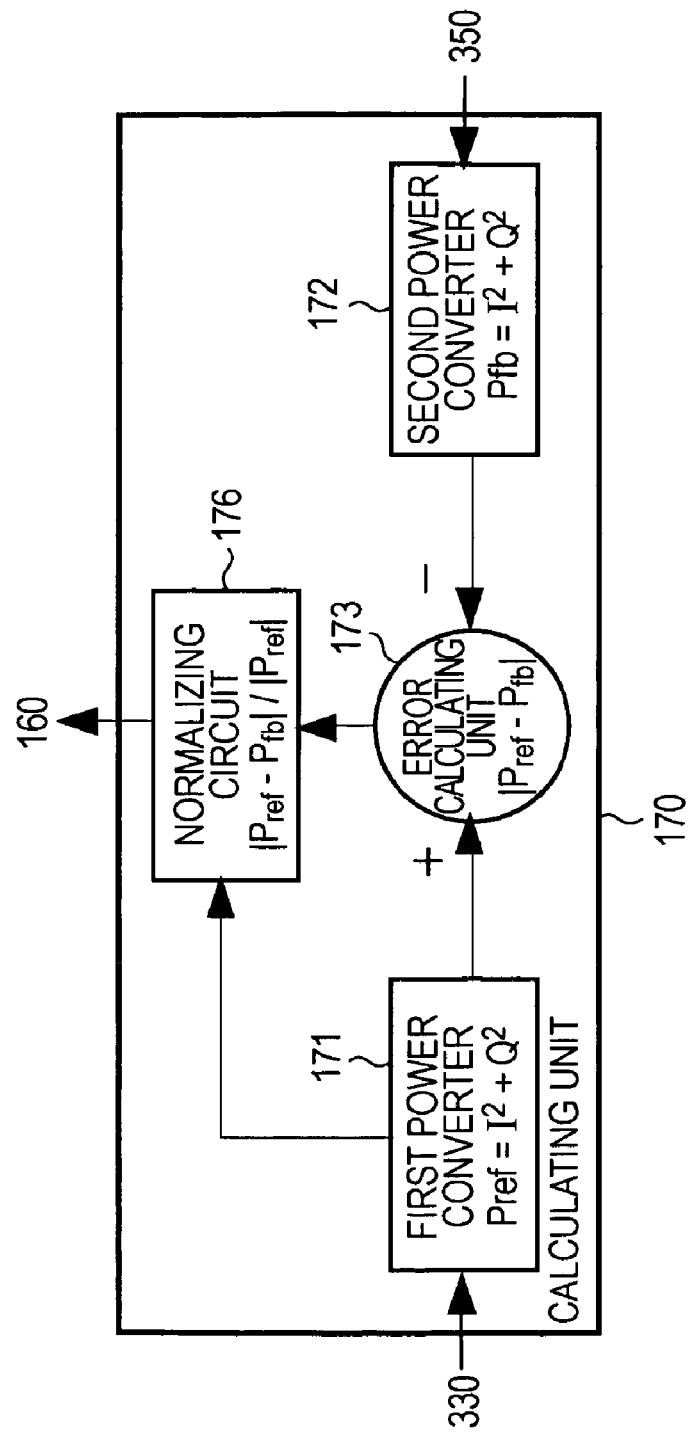
FIG. 11 illustrates a configuration of a more preferable calculating unit according to a fifth embodiment based on the fourth embodiment.

FIG. 11 illustrates a configuration of another preferable calculating unit 170 according to the fifth embodiment based on the fourth embodiment.

Referring to FIG. 11, in the calculating unit 170, the first power converter 171 performs power conversion on the transmission signal 330 serving as a reference signal. Since the transmission signal is a complex signal, the power conversion value Pref is expressed by the following expression.

$Pref=I^2+Q^2$

Likewise, in the calculating unit 170, the second power converter 172 performs power conversion on the feedback signal 350. Since the feedback signal 350 is a complex signal, the power conversion value Pfb of the feedback signal 350 is expressed by the following expression.

$Pfb=I^2+Q^2$

Then, in the calculating unit 170, an error calculating unit 173 calculates an absolute error |Pref−Pfb| between the power conversion value Pref of the transmission signal 330 and the power conversion value Pfb of the feedback signal 350. Then, a normalizing circuit 176 of the calculating unit 170 normalizes the absolute error |Pref−Pfb| calculated by the error calculating unit 173 by using the transmission signal 330 so as to generate a normalized error signal, as expressed by the following expression.

Normalized error signal=|Pref−Pfb|/|Pref|

The normalized error signal is transmitted to the filter control unit 160 and is used there to set a filter coefficient, as described above.

In the fifth embodiment illustrated in FIG. 11, the error signal is normalized by using the transmission signal 330, and thus the error signal can be generated without depending on the level of the transmission signal 330. Therefore, according to the distortion compensating apparatus 100 of the fifth embodiment, an adjusting operation that is resistant to variations in power of the transmission signal can be performed because the error signal used in control is normalized by using the transmission signal.

Sixth Embodiment

Figure 12:
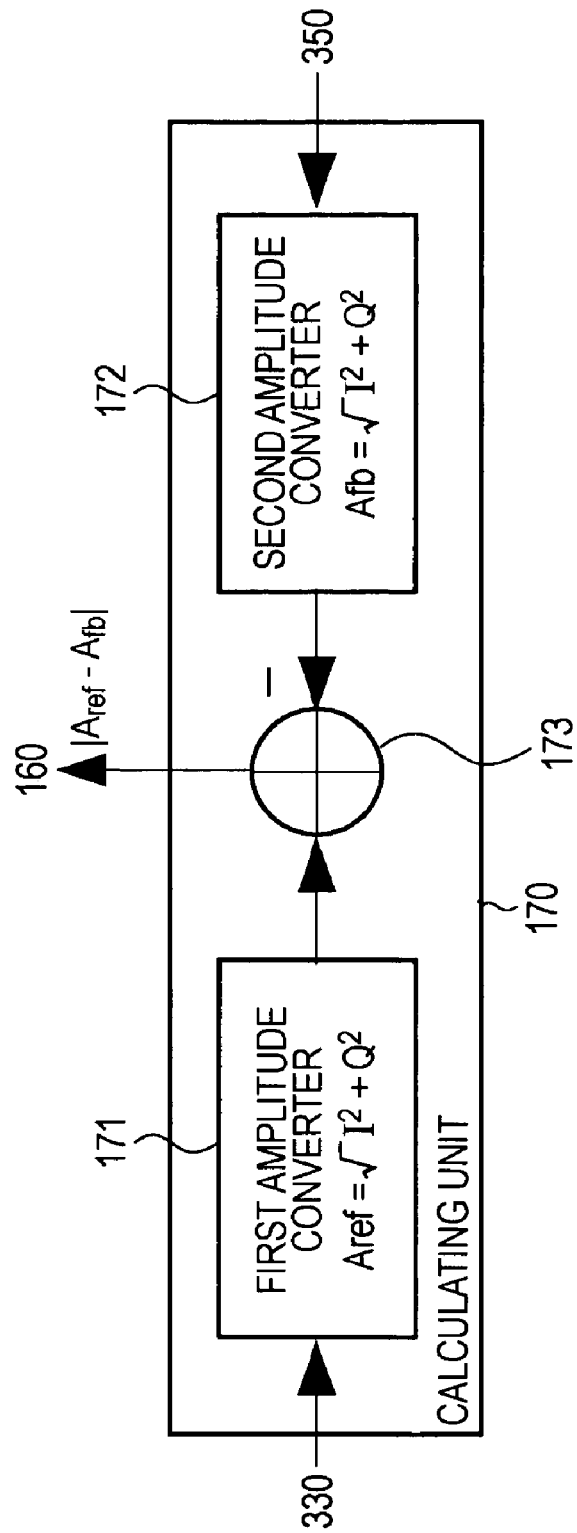
FIG. 12 illustrates a configuration of a calculating unit according to a sixth embodiment applicable to the first to third embodiments illustrated in FIGS. 4, 7, and 8.

FIG. 12 illustrates a configuration of a calculating unit 170 according to the sixth embodiment applicable to the first to third embodiments illustrated in FIGS. 4, 7, and 8.

In the calculating unit 170 according to the sixth embodiment, a first amplitude converter 171 and a second amplitude converter 172 calculate amplitudes of the transmission signal 330 and the feedback signal 350, respectively, and then the error therebetween is output.

In the calculating unit 170, the first amplitude converter 171 calculates an amplitude value Aref=$\sqrt{(I^2+Q^2)}$ of the transmission signal 330, whereas the second amplitude converter 172 calculates an amplitude value Afb=$\sqrt{(I^2+Q^2)}$ of the feedback signal 350.

Figure 13:
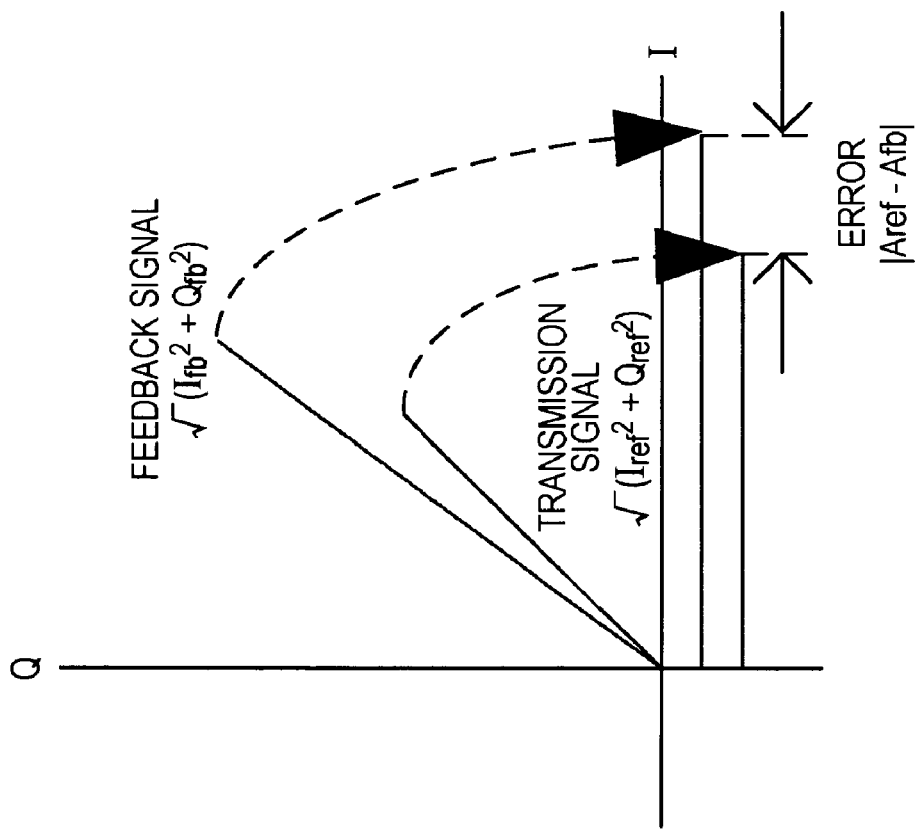
FIG. 13 illustrates a configuration to output an error between amplitude values Aref and Afb as a scalar error |Aref−Afb| according to the sixth embodiment.

Then, as illustrated in FIG. 13, the calculating unit 170 outputs the error between the amplitude values Aref and Afb as a scalar error |Aref−Afb| by using the adder 173, so as to transmit the scalar error to the filter control unit 160.

Seventh Embodiment

Figure 14:
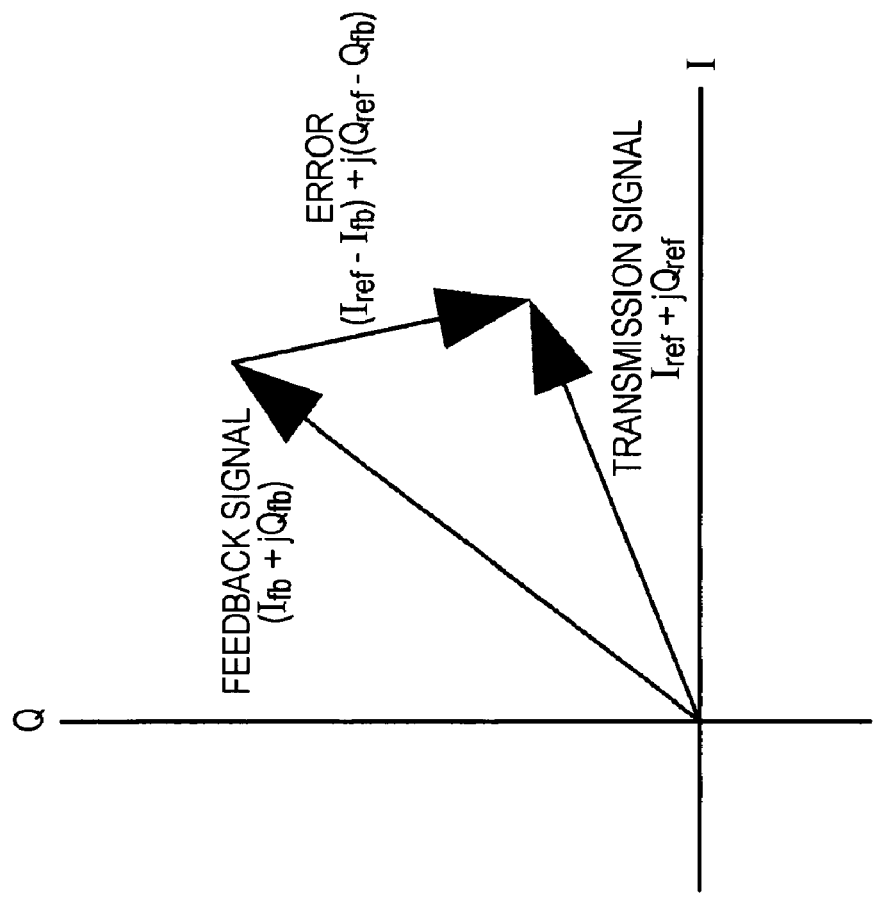
FIG. 14 illustrates a calculating unit according to a seventh embodiment applicable to the first to third embodiments illustrated in FIGS. 4, 7, and 8.

FIG. 14 illustrates a calculating unit 170 according to the seventh embodiment applicable to the first to third embodiments illustrated in FIGS. 4, 7, and 8.

In the seventh embodiment, each of the transmission signal 330 and the feedback signal 350 is a complex signal, and thus the calculating unit 170 calculates the error therebetween as a vector value.

The vector of the transmission signal 330 is $I_{ref}+jQ_{ref}$, whereas the vector of the feedback signal 350 is $I_{fb}+jQ_{fb}$.

Therefore, a vector error therebetween is as follows.

$(I_{ref}-I_{fb})+j(Q_{ref}-Q_{fb})$

On the basis of the vector error, the filter control unit 160 reads a filter coefficient from the memory 150 and sets it to the digital filter 130.

Eighth Embodiment

Figure 15:
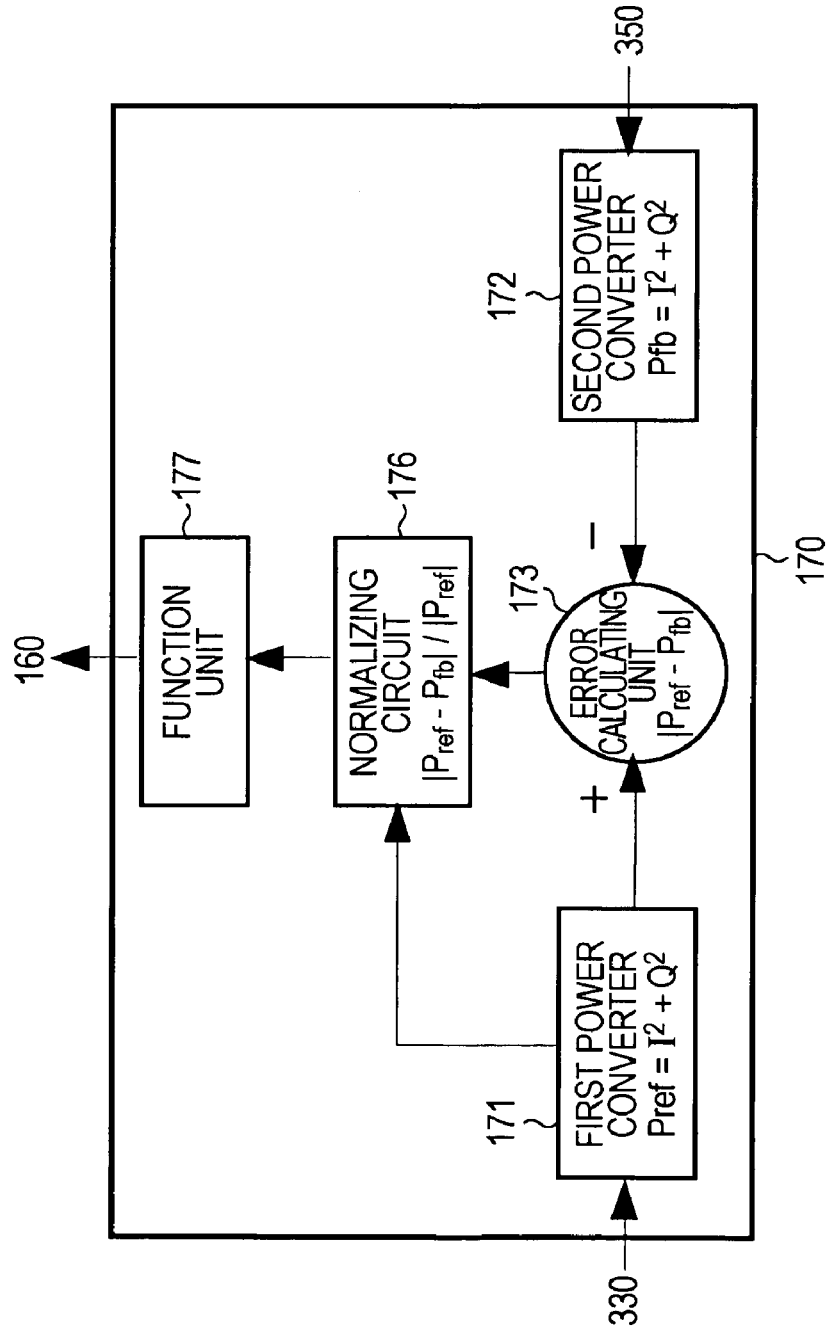
FIG. 15 illustrates a configuration of a calculating unit according to an eighth embodiment based on the configuration of the calculating unit according to the fifth embodiment illustrated in FIG. 11.

FIG. 15 illustrates a configuration of a calculating unit 170 according to the eighth embodiment. The eighth embodiment is based on the configuration of the calculating unit 170 according to the fifth embodiment illustrated in FIG. 11.

That is, as described above with reference to FIG. 11, the normalizing circuit 176 of the calculating unit 170 calculates an error signal normalized by using the transmission signal 330. The calculating unit 170 according to the eighth embodiment includes a function unit 177 to sample a certain number of normalized error signals and calculate an average or cumulative value of the error signals.

Since a coefficient value is set by the filter control unit 160 on the basis of the average or cumulative value of the error, a filter coefficient can be set more accurately.

Ninth Embodiment

Figure 16:
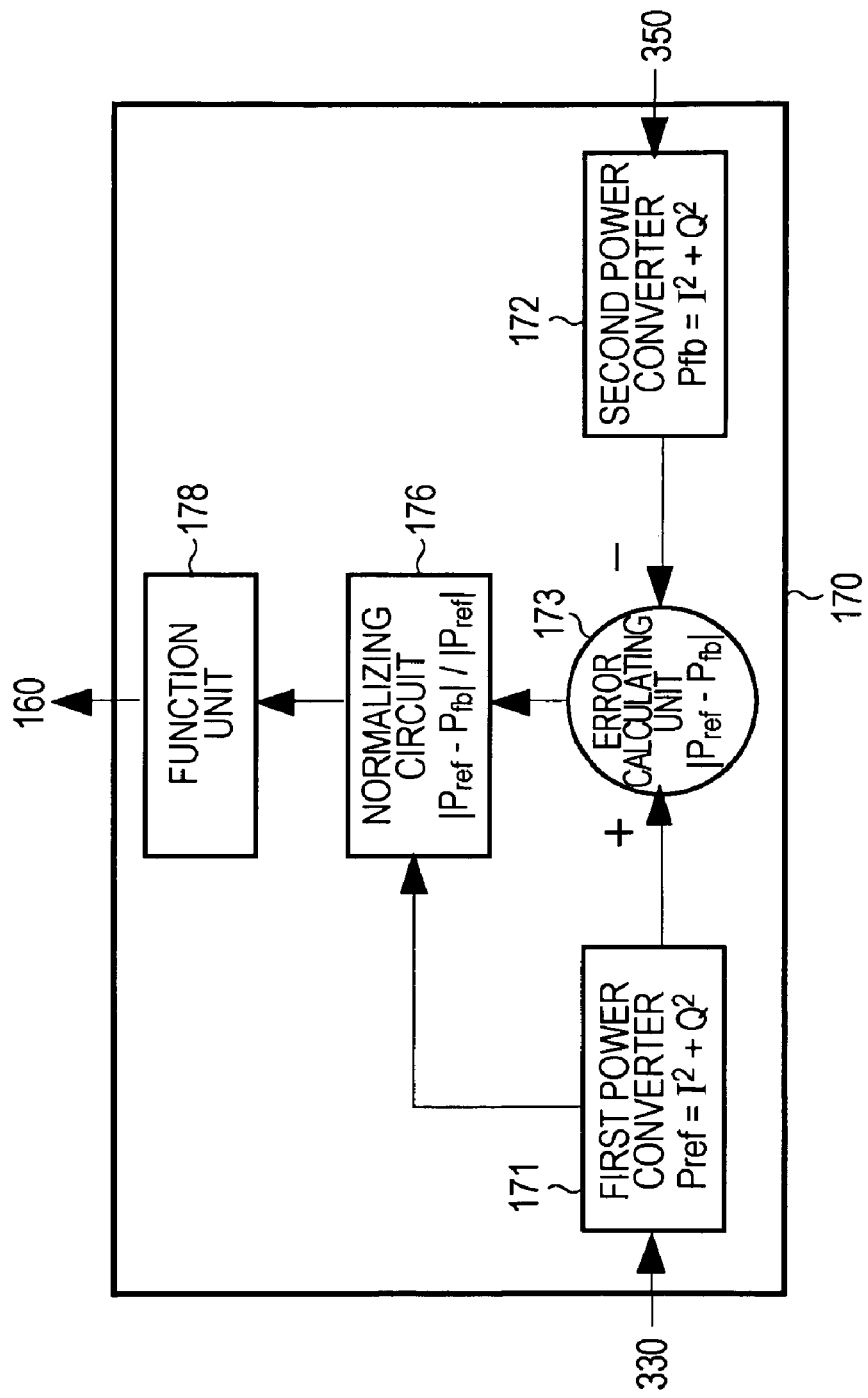
FIG. 16 illustrates a configuration of a calculating unit according to a ninth embodiment based on the configuration of the calculating unit according to the fifth embodiment illustrated in FIG. 11.

FIG. 16 illustrates a configuration of a calculating unit 170 according to the ninth embodiment. The ninth embodiment is based on the configuration of the calculating unit 170 according to the fifth embodiment illustrated in FIG. 11. Furthermore, the calculating unit 170 according to the ninth embodiment includes a function unit 178 to calculate a median value of a certain number of sampled errors instead of the function unit 177 described in the eighth embodiment illustrated in FIG. 15.

In the calculating unit 170 according to the ninth embodiment, a coefficient value of the digital filter 130 is set by the filter control unit 160 on the basis of the median value of errors obtained from the function unit 178.

Tenth Embodiment

Figure 17:
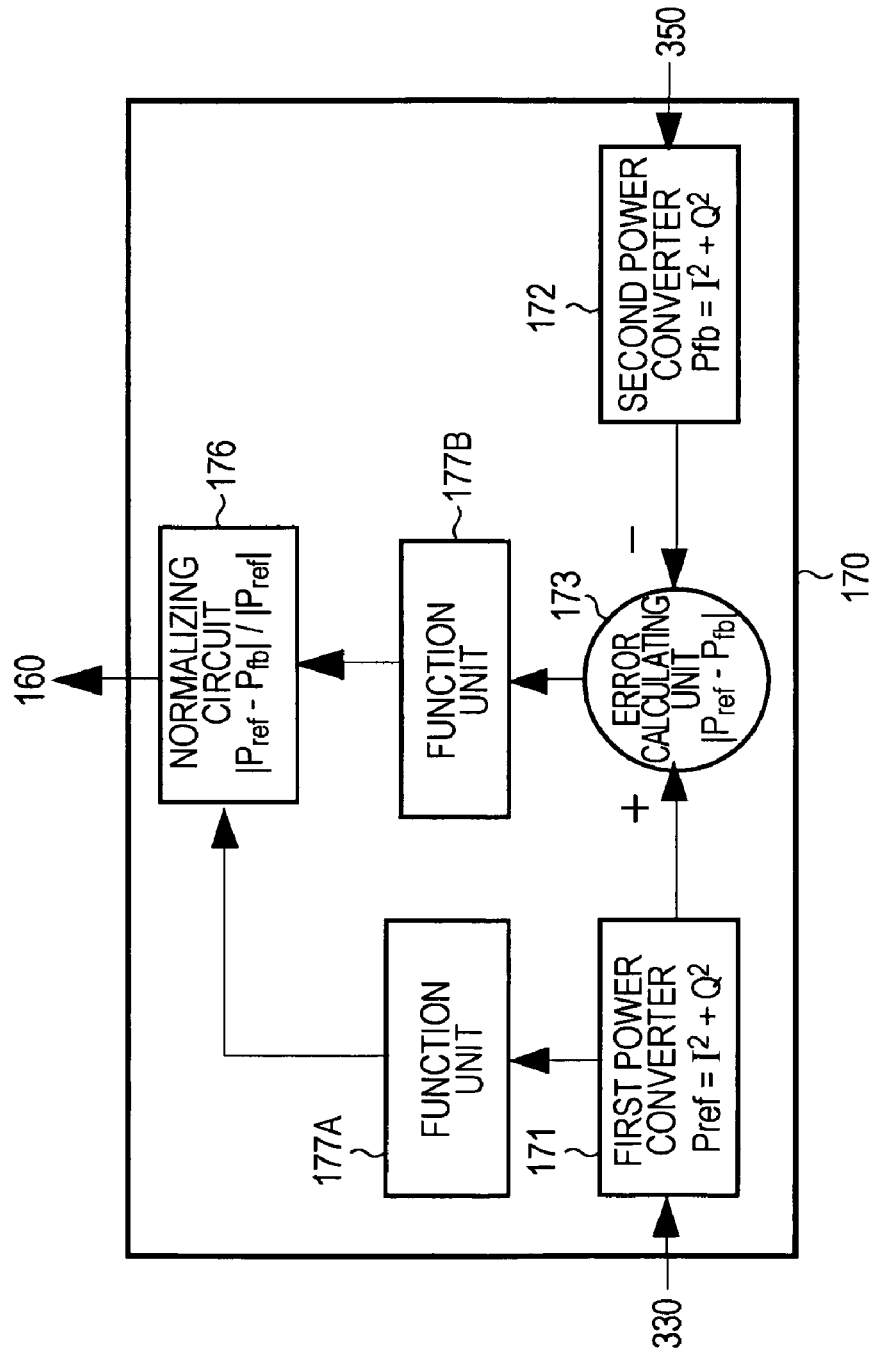
FIG. 17 illustrates a configuration of a calculating unit according to a tenth embodiment based on the configuration of the calculating unit according to the fifth embodiment illustrated in FIG. 11.

FIG. 17 illustrates a configuration of a calculating unit 170 according to the tenth embodiment. The tenth embodiment is based on the configuration of the calculating unit 170 according to the eighth embodiment illustrated in FIG. 15.

The calculating unit 170 according to the tenth embodiment includes a function unit 177A to perform an average/cumulative process on the transmission signal before normalization and a function unit 177B to perform an average/cumulative process on the error signal before normalization, instead of the function unit 177 which performs an average/cumulative process after normalization in the eighth embodiment illustrated in FIG. 15.

Eleventh Embodiment

Figure 18:
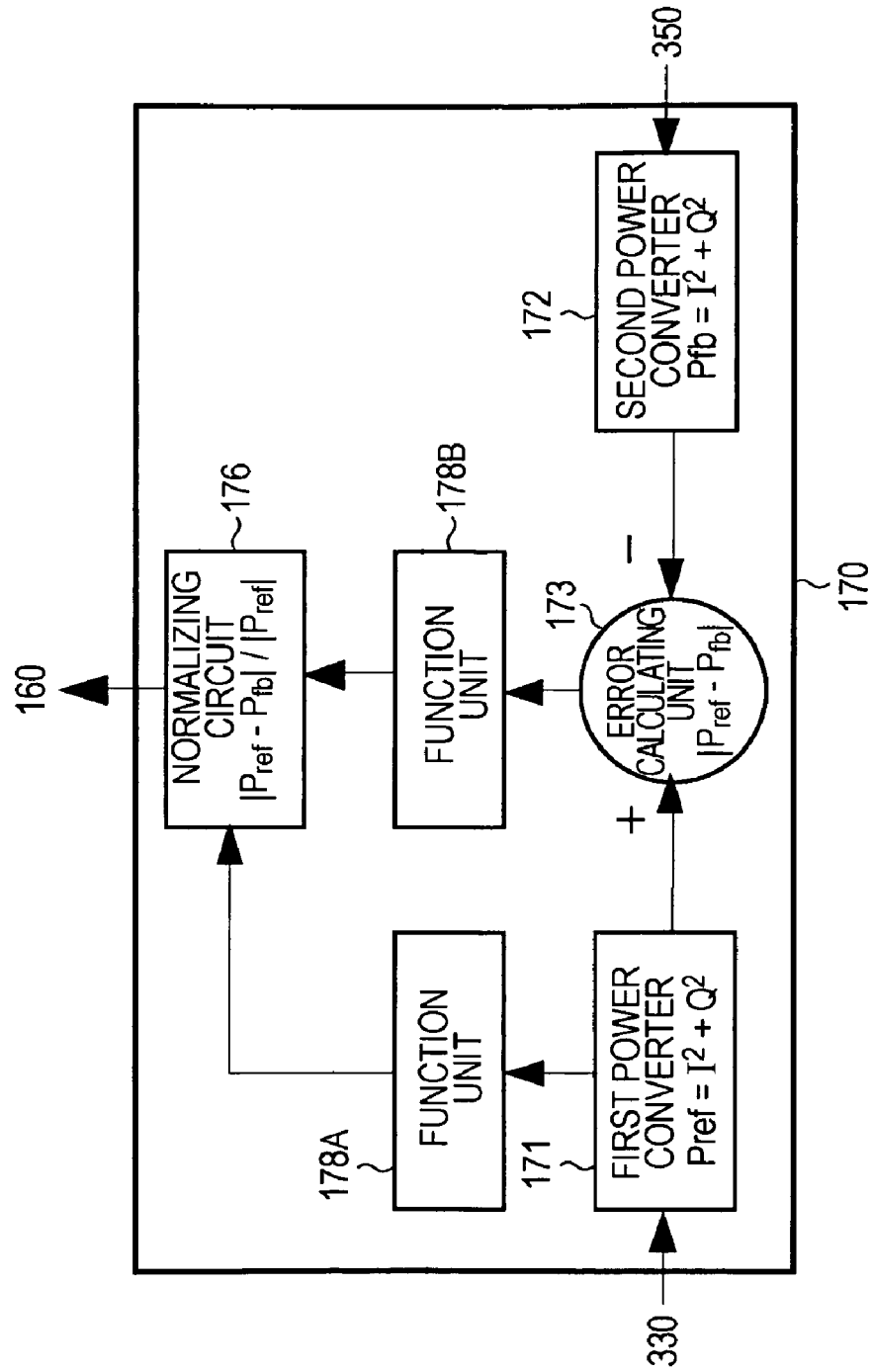
FIG. 18 illustrates a configuration of a calculating unit according to an eleventh embodiment based on the configuration of the calculating unit according to the fifth embodiment illustrated in FIG. 11.

FIG. 18 illustrates a configuration of a calculating unit 170 according to the eleventh embodiment. The eleventh embodiment is based on the configuration of the calculating unit 170 according to the ninth embodiment illustrated in FIG. 16.

The calculating unit 170 according to the eleventh embodiment includes a function unit 178A to calculate a median value of the transmission signal before normalization and a function unit 178B to calculate a median value of the error signal before normalization, instead of the function unit 178 which calculates a median value after normalization according to the ninth embodiment illustrated in FIG. 16.

Twelfth Embodiment

Figure 19:
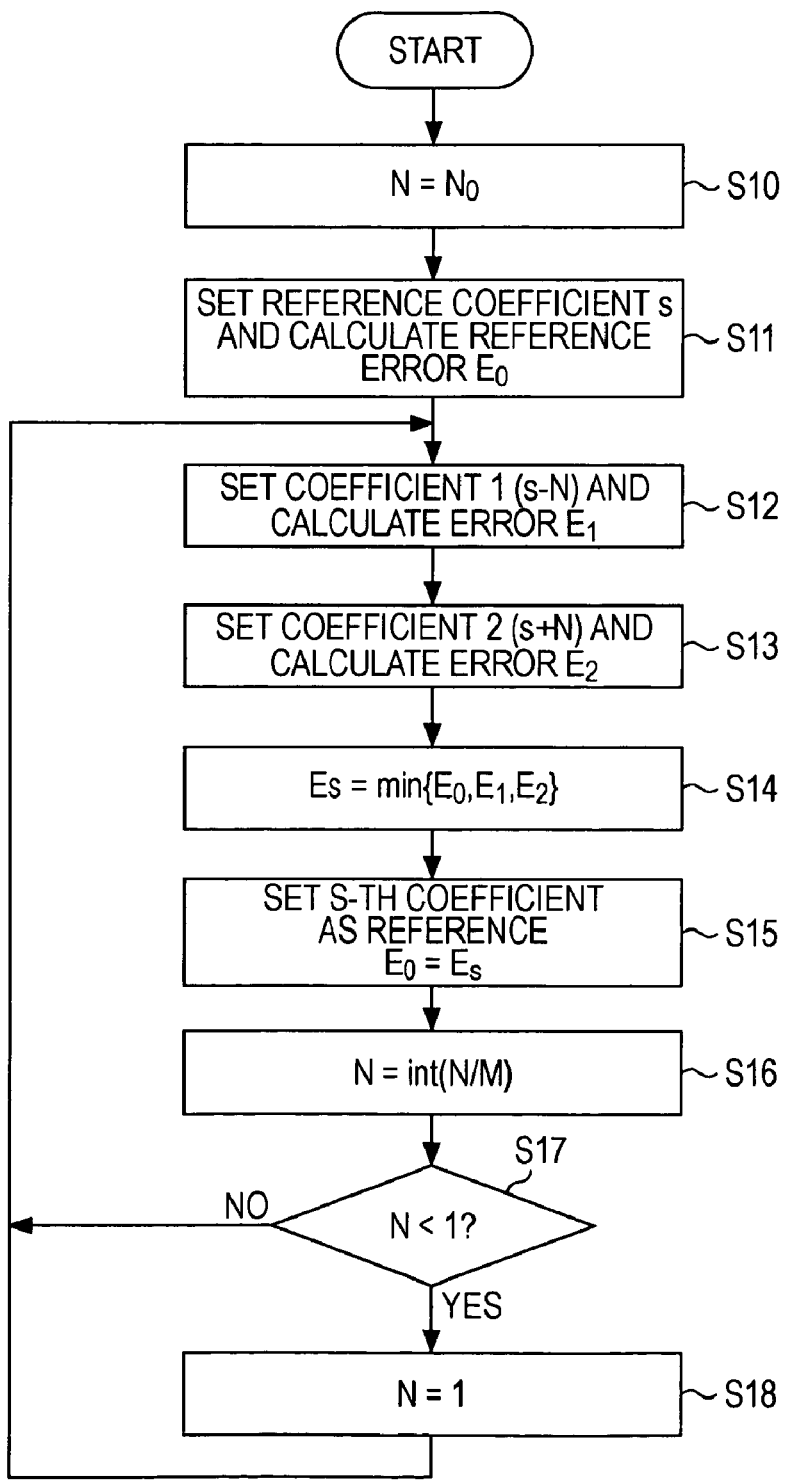
FIG. 19 is a process flowchart illustrating a setting method according to a twelfth embodiment different from the filter coefficient setting method illustrated in FIG. 5.

FIG. 19 is a flowchart illustrating a setting method according to a twelfth embodiment which is different from the filter coefficient setting method illustrated in FIG. 5.

Referring to FIG. 19, the distortion compensating apparatus 100 sets a counter value N to $N_0$ as a reference (step S10). Then, the filter control unit 160 of the distortion compensating apparatus 100 sets a reference coefficient s to the digital filter 130, and the calculating unit 170 calculates an error $E_0$ at the time when this coefficient is set (step S11).

Then, the distortion compensating apparatus 100 sets a filter coefficient (s−N), that is, a filter coefficient different from the reference coefficient s by the amount N, so that the reference filter coefficient s is center, and calculates an error $E_1$ (step S12).

Furthermore, the distortion compensating apparatus 100 sets a filter coefficient (s+N), that is, a filter coefficient different from the reference coefficient s by the amount N in the opposite direction, and calculates an error $E_2$ (step S13).

Then, the distortion compensating apparatus 100 determines the s-th coefficient to give a minimum error $E_s$ when the filter coefficients (s−N) and (s+N) different from the reference filter coefficient s by amounts +N and −N are set (step S14).

Then, the distortion compensating apparatus 100 sets the determined s-th coefficient as a reference ($E_0=E_s$) (step S15).

The distortion compensating apparatus 100 repeats the above-described steps S11 to S15 as one loop. At this time, the distortion compensating apparatus 100 decreases the rate of N from the reference filter coefficient s at every loop. In other words, the distortion compensating apparatus 100 multiplies N by 1/M at every loop (step S16).

Then, the distortion compensating apparatus 100 repeats the above-described loop until the N becomes smaller than 1. When N is smaller than 1, N is reset to 1 and a control operation is continued (step S18). By performing the process illustrated in FIG. 19, the coefficient to minimize the error can be calculated more quickly.

Now, measures to deal with a narrow frequency band of a transmission signal are described as an example of the twelfth embodiment. FIG. 20 illustrates a configuration and an operation based on the calculating unit 170 according to the first and fourth embodiments illustrated in FIGS. 4 and 10 in the case where the frequency band of the transmission signal is narrow.

That is, the configuration according to the twelfth embodiment illustrated in FIG. 20 is a configuration for adjusting a feedback signal. First, the first power converter 171 and the second power converter 172 perform power conversion on the transmission signal 330 and the feedback signal 350, respectively. Then, the error calculating unit 173 calculates an error by using the transmission signal 330 and a signal generated by a multiplier 182 by multiplying the feedback signal 350 by a gain decided by a deciding circuit 181 on the basis of frequency information of a signal 180. The calculated error is input to the filter control unit 160.

Filter coefficients designed in advance are stored in the filter coefficient group holding memory 150. For example, assume the case where coefficients targeted for a wide band signal I illustrated in FIG. 20 are stored (I in FIG. 20). Average power in the band does not vary even if the slope of the filter characteristic changes due to correction of the equalizer.

However, if the signal changes to a narrow band (II in FIG. 20: where the center frequency of the signal changes), average power of the feedback signal changes when the center frequency of the signal changes. This is because a filter coefficient of the primary slope with reference to the center frequency (point A in FIG. 20) of the wide band signal is used.

That is, the equalizer uses the error between the transmission signal and the feedback signal, and thus malfunctions because the power of the changed feedback signal is regarded as an error.

On the other hand, in the twelfth embodiment, the calculating unit 170 is characterized by performing an error calculation after adjusting the magnitude of the transmission signal 330 or the feedback signal 350 from the nonlinear distortion circuit.

In the example illustrated in FIG. 20, the multiplier 182 multiplies the feedback signal 350 by the gain so as to correct the feedback signal 350 to the same average power as that of the transmission signal 330. Accordingly, an error signal can be generated without depending on the center frequency of the signal.

As described above, in the distortion compensating apparatus 100 according to the first to twelfth embodiments, the calculating unit 170 calculates an error between a transmission signal and a feedback signal, and the filter control unit 160 performs control to select a filter coefficient to minimize the error. Therefore, the distortion compensating apparatus 100 enables a significant reduction in the number of calculations and in the time to select a filter coefficient. Furthermore, in the distortion compensating apparatus 100 according to the first to twelfth embodiments, the calculating unit 170 is configured to directly compare a transmission signal and a feedback signal. With this configuration, a change in configuration due to the type of signal does not occur and a general-purpose configuration can be obtained.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

In regard to Embodiments 1 to 12 described above, the following additional descriptions are disclosed.

Additional Description 1

A distortion compensating apparatus comprising: an adaptive distortion compensating unit to compensate nonlinear distortion by controlling an input signal of a nonlinear distortion circuit by using an adaptive algorithm so as to reduce an error between a reference signal and a feedback signal from the nonlinear distortion circuit having the nonlinear distortion; an adaptive equalizer connected between the adaptive distortion compensating unit and the nonlinear distortion circuit or in a previous stage of the adaptive distortion compensating unit, wherein the adaptive equalizer includes a digital filter to form an amplitude characteristic and a phase characteristic of the input signal on the basis of a filter coefficient group that is set to the digital filter; a memory to hold in advance the filter coefficient group to be set to the digital filter; and a control unit to control reading of the filter coefficient group to be set to the digital filter from the memory on the basis of the input signal and the feedback signal from the nonlinear distortion circuit.

Additional Description 2

The distortion compensating apparatus according to Additional Description 1, further comprising: a calculating unit to calculate an error between the input signal and the feedback signal from the nonlinear distortion circuit, wherein the control unit controls the filter coefficient group to be read from the memory in accordance with the error between the input signal and the feedback signal from the nonlinear distortion circuit calculated by the calculating unit and to be set to the digital filter.

Additional Description 3

The distortion compensating apparatus according to Additional Description 2, wherein the calculating unit calculates, as the error between the input signal and the feedback signal from the nonlinear distortion circuit, a difference in power between the input signal and the feedback signal from the nonlinear distortion circuit.

Additional Description 4

The distortion compensating apparatus according to Additional Description 2, wherein the calculating unit calculates, as the error between the input signal and the feedback signal from the nonlinear distortion circuit, a difference in amplitude between the input signal and the feedback signal from the nonlinear distortion circuit.

Additional Description 5

The distortion compensating apparatus according to Additional Description 2, wherein the calculating unit calculates, as the error between the input signal and the feedback signal from the nonlinear distortion circuit, a difference in complex vector between the input signal and the feedback signal from the nonlinear distortion circuit.

Additional Description 6

The distortion compensating apparatus according to Additional Description 2, wherein the calculating unit normalizes the calculated error by using the input signal.

Additional Description 7

The distortion compensating apparatus according to Additional Description 2, wherein the calculating unit calculates the error after adjusting the magnitude of any one of the input signal and the feedback signal from the nonlinear distortion circuit.

Additional Description 8

The distortion compensating apparatus according to Additional Description 2, wherein the control unit sets a plurality of filter coefficients, compares errors between the input signal and the feedback signal from the nonlinear distortion circuit for the respective set filter coefficients, determines the filter coefficient to minimize the error, and sets the determined filter coefficient to the digital filter.

Additional Description 9

The distortion compensating apparatus according to Additional Description 8, wherein the control unit performs a plurality of comparisons in setting the filter coefficients, sets a coefficient different by a given coefficient value from a reference filter coefficient in the comparison, and changes the coefficient by the given coefficient value in accordance with the number of comparisons.

Additional Description 10

The distortion compensating apparatus according to Additional Description 6, wherein the calculating unit outputs an average value of the error normalized by using the input signal to the control unit.

Additional Description 11

The distortion compensating apparatus according to Additional Description 6, wherein the calculating unit outputs a median value of the error normalized by using the input signal to the control unit.

Additional Description 12

The distortion compensating apparatus according to Additional Description 6, wherein the calculating unit calculates an average value of the calculated error and normalizes the calculated average value by using the input signal.

Additional Description 13

The distortion compensating apparatus according to Additional Description 6, wherein the calculating unit calculates a median value of the calculated error and normalizes the calculated median value by using the input signal.

Additional Description 14

A power amplifier apparatus comprising:

a power amplifier; and a distortion compensating apparatus connected to an input side of the power amplifier, wherein the distortion compensating apparatus includes an adaptive distortion compensating unit to compensate nonlinear distortion by controlling an input signal of the power amplifier by using an adaptive algorithm so as to reduce an error between a transmission signal and a feedback signal from the power amplifier; and an adaptive equalizer connected between the adaptive distortion compensating unit and the power amplifier or in a previous stage of the adaptive distortion compensating unit, and wherein the adaptive equalizer includes a digital filter to form an amplitude characteristic and a phase characteristic of the input signal on the basis of a filter coefficient group that is set to the digital filter; a memory to hold in advance the filter coefficient group to be set to the digital filter; and a control unit to control reading of the filter coefficient group to be set to the digital filter from the memory on the basis of the input signal and the feedback signal from the power amplifier.

Additional Description 15

The power amplifier apparatus according to Additional Description 14, further comprising: a calculating unit to calculate an error between the input signal and the feedback signal from the power amplifier, wherein the control unit controls the filter coefficient group to be read from the memory in accordance with the error between the input signal and the feedback signal from the power amplifier calculated by the calculating unit and to be set to the digital filter.

The invention claimed is:

1. A distortion compensating apparatus comprising:
an adaptive distortion compensating unit to compensate nonlinear distortion by controlling an input signal of a nonlinear distortion circuit by using an adaptive algorithm so as to reduce an error between a reference signal and a feedback signal from the nonlinear distortion circuit having the nonlinear distortion;
an adaptive equalizer connected between the adaptive distortion compensating unit and the nonlinear distortion circuit or to a front part of the adaptive distortion compensating unit; and
a calculating unit to calculate an error between the input signal and the feedback signal from the nonlinear distortion circuit,
wherein the adaptive equalizer includes
a digital filter to form an amplitude characteristic and a phase characteristic of the input signal on the basis of a filter coefficient group that is set to the digital filter;
a memory to hold in advance the filter coefficient group to be set to the digital filter; and
a control unit to control reading of the filter coefficient group to be set to the digital filter from the memory on the basis of the input signal and the feedback signal from the nonlinear distortion circuit,
wherein the control unit controls the filter coefficient group to be read from the memory in accordance with the error between the input signal and the feedback signal from the nonlinear distortion circuit calculated by the calculating unit and to be set to the digital filter, and
wherein the calculating unit normalizes the calculated error by using the input signal.

2. The distortion compensating apparatus according to claim 1, wherein the calculating unit calculates, as the error between the input signal and the feedback signal from the nonlinear distortion circuit, a difference in power between the input signal and the feedback signal from the nonlinear distortion circuit.

3. The distortion compensating apparatus according to claim 1, wherein the calculating unit calculates, as the error between the input signal and the feedback signal from the nonlinear distortion circuit, a difference in amplitude between the input signal and the feedback signal from the nonlinear distortion circuit.

4. The distortion compensating apparatus according to claim 1, wherein the calculating unit calculates, as the error between the input signal and the feedback signal from the nonlinear distortion circuit, a difference in complex vector between the input signal and the feedback signal from the nonlinear distortion circuit.

5. The distortion compensating apparatus according to claim 1, wherein the calculating unit calculates the error after adjusting the magnitude of anyone of the input signal and the feedback signal from the nonlinear distortion circuit.

6. The distortion compensating apparatus according to claim 1, wherein the control unit sets a plurality of filter coefficients, compares errors between the input signal and the feedback signal from the nonlinear distortion circuit for the respective set filter coefficients, determines the filter coefficient to minimize the error, and sets the determined filter coefficient to the digital filter.

7. The distortion compensating apparatus according to claim 6, wherein the control unit performs a plurality of comparisons in setting the filter coefficients, sets a coefficient different by a given coefficient value from a reference filter coefficient in the comparison, and changes the coefficient by the given coefficient value in accordance with the number of comparisons.

8. The distortion compensating apparatus according to claim 1, wherein the calculating unit outputs an average value of the error normalized by using the input signal to the control unit.

9. The distortion compensating apparatus according to claim 1, wherein the calculating unit outputs a median value of the error normalized by using the input signal to the control unit.

10. The distortion compensating apparatus according to claim 1, wherein the calculating unit calculates an average value of the calculated error and normalizes the calculated average value by using the input signal.

11. The distortion compensating apparatus according to claim 1, wherein the calculating unit calculates a median value of the calculated error and normalizes the calculated median value by using the input signal.

12. A power amplifier apparatus comprising:
a power amplifier; and
a distortion compensating apparatus connected to an input side of the power amplifier,
wherein the distortion compensating apparatus includes
an adaptive distortion compensating unit to compensate nonlinear distortion by controlling an input signal of the power amplifier by using an adaptive algorithm so as to reduce an error between a transmission signal and a feedback signal from the power amplifier;
an adaptive equalizer connected between the adaptive distortion compensating unit and the power amplifier or connected to a front part of the adaptive distortion compensating unit; and
a calculating unit to calculate an error between the input signal and the feedback signal from the power amplifier,
wherein the adaptive equalizer includes
a digital filter to form an amplitude characteristic and a phase characteristic of the input signal on the basis of a filter coefficient group that is set to the digital filter;
a memory to hold in advance the filter coefficient group to be set to the digital filter; and
a control unit to control reading of the filter coefficient group to be set to the digital filter from the memory on the basis of the input signal and the feedback signal from the power amplifier,
wherein the control unit controls the filter coefficient group to be read from the memory in accordance with the error between the input signal and the feedback signal from the power amplifier calculated by the calculating unit and to be set to the digital filter, and
wherein the calculating unit normalizes the calculated error by using the input signal.

* * * * *